(12) United States Patent
Wang

(10) Patent No.: US 10,468,068 B2
(45) Date of Patent: Nov. 5, 2019

(54) VIBRATION-PROOF FASTENER POST STRUCTURE

(71) Applicant: FIVETECH TECHNOLOGY INC., New Taipei (TW)

(72) Inventor: Ting-Jui Wang, New Taipei (TW)

(73) Assignee: FIVETECH TECHNOLOGY INC., New Taipei (TW)

( * ) Notice: Subject to any disclaimer, the term of this patent is extended or adjusted under 35 U.S.C. 154(b) by 0 days.

(21) Appl. No.: 16/298,114

(22) Filed: Mar. 11, 2019

(65) Prior Publication Data

US 2019/0206447 A1  Jul. 4, 2019

Related U.S. Application Data

(62) Division of application No. 15/813,801, filed on Nov. 15, 2017, now Pat. No. 10,319,413.

(51) Int. Cl.

| | |
|---|---|
| *G11B 33/08* | (2006.01) |
| *F16B 13/12* | (2006.01) |
| *G06F 1/18* | (2006.01) |
| *F16F 15/08* | (2006.01) |
| *G05D 19/00* | (2006.01) |
| *H05K 5/00* | (2006.01) |

(52) U.S. Cl.
CPC ............ *G11B 33/08* (2013.01); *F16B 13/124* (2013.01); *F16F 15/08* (2013.01); *G05D 19/00* (2013.01); *G06F 1/181* (2013.01); *G06F 1/184* (2013.01); *H05K 5/00* (2013.01)

(58) Field of Classification Search
CPC .... F16B 21/09; F16B 19/1063; F16B 19/109; F16B 5/0036; F16B 5/008; F16B 5/0208; F16B 5/0266; F16B 12/22; F16B 12/34
See application file for complete search history.

(56) References Cited

U.S. PATENT DOCUMENTS

| 6,022,009 A | 2/2000 | Hill |
|---|---|---|
| 6,074,146 A | 6/2000 | Soemer |
| 10,047,779 B2 | 8/2018 | Wang |

(Continued)

FOREIGN PATENT DOCUMENTS

| DE | 102006039761 B3 | 2/2008 |
|---|---|---|
| GB | 1520891 A | 8/1978 |

OTHER PUBLICATIONS

Office Action dated Dec. 6, 2018 for U.S. Appl. No. 15/813,801.

*Primary Examiner* — Daniel J Wiley
(74) *Attorney, Agent, or Firm* — Schmeiser, Olsen & Watts, LLP

(57) ABSTRACT

A vibration-proof fastener post structure includes a body portion having a first end integrally formed with or assembled to a first object; a fastening head portion movably mounted to a second end of the body portion and having a neck portion, which is movably disposed in the body portion for moving in a slideway hole of a second object; and an elastic element movably fitted around the neck portion to push against the body portion. The fastening head portion and the body portion are configured for engaging with and fastening to the slideway hole of the second object. The second object is slidably relative to the neck portion. When the second object is slid to a predetermined position, the fastening head portion and the elastic element, the body portion or the pushing member will engage with the slideway hole of the second object to achieve a vibration-proof fastening effect.

8 Claims, 28 Drawing Sheets

(56) References Cited

U.S. PATENT DOCUMENTS

| | | |
|---|---|---|
| 2006/0251473 A1 | 11/2006 | Tyski |
| 2007/0274777 A1 | 11/2007 | Winkler |
| 2009/0060680 A1 | 3/2009 | Chen |
| 2011/0123291 A1 | 5/2011 | Chiu |
| 2012/0250231 A1 | 10/2012 | Xiao |
| 2015/0063905 A1 | 3/2015 | Wang |
| 2016/0374202 A1 | 12/2016 | Wang |

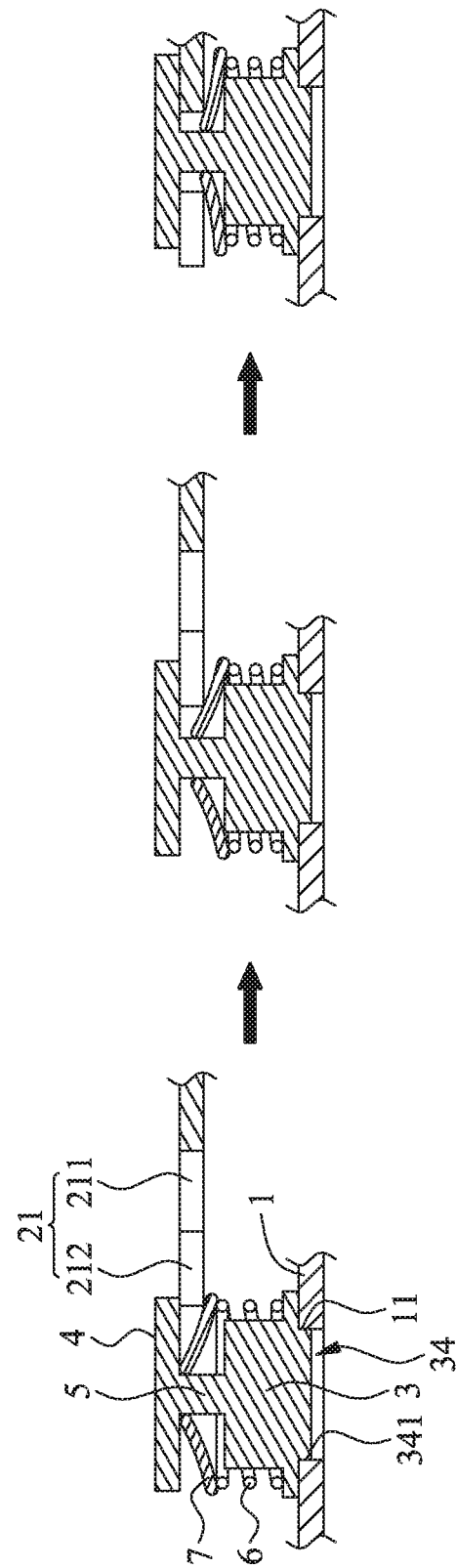

ial patent application of U.S.
VIBRATION-PROOF FASTENER POST STRUCTURE

CROSS-REFERENCE TO RELATED APPLICATION

This application is a divisional patent application of U.S. application Ser. No. 15/813,801 filed on Nov. 15, 2017, the entire contents of which are hereby incorporated by reference for which priority is claimed under 35 U.S.C. § 120.

FIELD OF THE INVENTION

The present invention relates to a connecting post structure, and more particularly, to a vibration-proof fastener post structure for connecting to between a first and a second object, such that the second object is slidable relative to the fastener post structure to a predetermined position and the fastener post structure can be fastened to the second object in a vibration-proof manner when the second object has been moved to the predetermined position.

BACKGROUND OF THE INVENTION

A conventional connection structure for connecting a circuit board or some other type of plate to a chassis or a motherboard includes a fixing element, such as a screw or a rivet, for connecting to between the circuit board/plate and the chassis/motherboard, so that the circuit board/plate is fixedly mounted on the chassis/motherboard. That is, the circuit board/plate is not freely movable once it is connected to the chassis/motherboard. Presently, however, in many cases of installing or mounting the circuit board/plate, the circuit board/plate must be slidable to a predetermined position and then be fastened to the chassis/motherboard. Therefore, the conventional connection structure can no longer meet the current connection requirement, and it is necessary to develop newer connection structures that must not be too complicate in design in order to be cost effective. Moreover, in many cases, the circuit board/plate must be installed in a vibration-proof manner. Therefore, the new connection structure should not only satisfy the above-described slidable, locating and fastening function, but also be vibration-proof or shock-absorbing. Therefore, it is an object of the present invention to develop a connection structure with fastening and shock-absorbing functions for connecting to between two plate members, such that one of the plate members can be slid relative to the other one to a predetermined position for connecting to the other plate in a vibration-proof manner.

SUMMARY OF THE INVENTION

In view of the drawbacks of the conventional connection structure for connecting a circuit board or a plate to a chassis or a motherboard, it is a primary object of the present invention to develop a vibration-proof fastener post structure for connecting to between two objects, such that one of the objects can be slid relative to the other one to a predetermined position and be fastened in place by the fastener post structure in a vibration-proof manner.

To achieve the above and other objects, the vibration-proof fastener post structure provided according to the present invention has an end for fixedly connecting to a first object and another end for slidably connecting to a second object and engaging with a slideway hole on the second object to thereby fasten the second object to the first object. The vibration-proof fastener post structure according to a preferred embodiment of the present invention includes a body portion having a first end, which can be integrally formed with or assembled to the first object; a fastening head portion movably mounted to a second end of the body portion and having a neck portion, which is movably disposed in the body portion without exposing from the first end of the body portion or the first object and is movable in the slideway hole of the second object; and an elastic element movably fitted around the neck portion to push against the body portion. In this embodiment, the fastening head portion and the body portion are configured for engaging with and fastening to the slideway hole of the second object.

In the above embodiment, the body portion can have a first beveled guide surface facing toward the second object for engaging with and fastening to the slideway hole.

In the above embodiment, the fastening head portion can have a second beveled guide surface facing toward the second object for engaging with and fastening to the slideway hole.

In the above embodiment, the fastening head portion can include a handling portion, a protruded stop portion located at one side of the handling portion facing toward the second object, and a second beveled guide surface formed on around the protruded stop portion. The protruded stop portion and the second beveled guide surface are configured for engaging with and fastening to the slideway hole.

In the above embodiment, the neck portion can include a shoulder portion for abutting on the second end of the body portion to keep the fastening head portion away from the body portion by a distance.

In the above embodiment, the neck portion can include a stopper formed at an end thereof. The stopper can be integrally formed with or assembled to the neck portion, and the elastic element has an end pushing against the stopper.

In the above embodiment, the slideway hole of the second object can have a beveled guide surface, and the body portion is configured for engaging with and fastening to the beveled guide surface.

In the above embodiment, the slideway hole of the second object can include a hole portion and a sliding slot communicable with the hole portion. When the neck portion is moved in along the sliding slot, the fastening head portion and the body portion can engage with the hole portion or the sliding slot and be fastened thereto.

In the above embodiment, the slideway hole of the second object can include two or more hole portions and a sliding slot communicable with the hole portions. When the neck portion is moved in along the sliding slot, the fastening head portion and the body portion can engage with any of the hole portions and be fastened thereto.

To achieve the above and other objects, the vibration-proof fastener post structure provided according to the present invention has an end for fixedly connecting to a first object and another end for slidably connecting to a second object and engaging with a slideway hole on the second object to thereby fasten the second object to the first object. The vibration-proof fastener post structure according to another preferred embodiment of the present invention includes a body portion having a first end, which can be integrally formed with or assembled to the first object; a pushing member movably disposed at a second end of the body portion; a fastening head portion movably located at an end of the pushing member and having a neck portion, which is extended through the pushing member and located in the body portion to be movable in the slideway hole of the second object; and an elastic element movably fitted around the neck portion to press against the pushing member. The fastening head portion and the pushing member are configured for engaging with and fastening to the slideway hole of the second object.

In the above embodiment, the pushing member can include a third beveled guide surface facing toward the second object for engaging with and fastening to the slideway hole.

In the above embodiment, the pushing member can be a conical body, a flat body, a ball-shaped body, an oblong body or a bar-shaped body having an axial bore; and the neck portion is configured for extending through the axial bore.

In the above embodiment, the slideway hole of the second object can have a beveled guide surface, and the pushing member is configured for engaging with and fastening to the beveled guide surface.

In the above embodiment, the slideway hole of the second object can include a hole portion and a sliding slot communicable with the hole portion. When the neck portion is moved in along the sliding slot, the fastening head portion and the pushing member can engage with the hole portion or the sliding slot and be fastened thereto.

In the above embodiment, the slideway hole of the second object can include two or more hole portions and a sliding slot communicable with the hole portions. When the neck portion is moved in along the sliding slot, the fastening head portion and the pushing member can engage with any of the hole portions and be fastened thereto.

To achieve the above and other objects, the vibration-proof fastener post structure provided according to the present invention has an end for fixedly connecting to a first object and another end for slidably connecting to a second object and engaging with a slideway hole on the second object to thereby fasten the second object to the first object. The vibration-proof fastener post structure according to a further preferred embodiment of the present invention includes a body portion having a first end, which can be integrally formed with or assembled to the first object; a fastening head portion movably or fixedly assembled to or integrally formed with a second end of the body portion and having a neck portion, which is movably assembled to the body portion without exposing from the first end of the body portion or from the first object and is movable in the slideway hole of the second object; and an elastic element movably fitted around the neck portion located at the second end of the body portion. The fastening head portion and the elastic element are configured for engaging with and fastening to the slideway hole of the second object.

In the above embodiment, the neck portion can include a second shoulder portion, and the elastic element has an end pressed against the second shoulder portion.

In the above embodiment, the second shoulder portion has a height smaller than a thickness of the second object, such that the elastic element presses against the second object when the second object is engaged with the neck portion.

In the above embodiment, the second shoulder portion can be formed on an end of the neck portion adjacent to the fastening head portion, or on another end of the neck portion opposite to the fastening head portion.

In the above embodiment, the neck portion can include a first stop portion and a second stop portion that form a stepped shape on the neck portion; and the elastic element has an end pressed against the first stop portion.

In the above embodiment, the body portion can include a first stop portion and a second stop portion that form a stepped shape on the body portion; and the elastic element has an end pressed against the first stop portion.

In the above embodiment, the elastic element can be in the form of a hollow helical wire, a hollow conical body, a hollow corrugated plate, a hollow ball-shaped body, a hollow oblong body or a hollow bar-shaped body; and the neck portion is extended through the elastic element.

In the above embodiment, the slideway hole of the second object can have a beveled guide surface, and the elastic element is pressed against the beveled guide surface.

In the above embodiment, the slideway hole of the second object can include a hole portion and a sliding slot communicable with the hole portion. When the neck portion is moved in along the sliding slot, the fastening head portion and the elastic element can engage with the hole portion and be fastened thereto.

In the above embodiment, the elastic element can be a hollow body and the neck portion is extended through the elastic element.

In the above embodiment, the elastic element is a coil spring, a flat spring or a bar-shaped elastic body; and the elastic element can be made of a metal material, a plastic material, a rubber material or a silicon material.

In the above embodiment, the flat spring is a corrugated, a conical or a curved plate.

In the above embodiment, the elastic element can include a cut, and the neck portion can be forced through the cut to engage with the elastic element.

In the above embodiment, the slideway hole of the second object can include two or more hole portions and a sliding slot communicable with the hole portions. When the neck portion is moved in along the sliding slot, the fastening head portion and the elastic element can engage with any of the hole portions or with the sliding slot and be fastened thereto.

In the above embodiment, the first end of the body portion can be a connecting section for connecting to a fixing hole on the first object.

In the above embodiment, the fastening head portion and the neck portion can be integrally formed with or assembled to each other; or the neck portion and the body portion can be integrally formed with or assembled to each other.

In the above embodiment, the fastening head portion can include a colored cover. The colored cover can be formed on the fastening head portion by paint spraying, plastic injection molding, glue bonding, dyeing, coating or electrical plating.

In the above embodiment, the vibration-proof fastener post structure can further include a carrier and a removable cover. The carrier includes a plurality of receiving compartments, each of which has one piece of the vibration-proof fastener post structure received therein; and the removable cover closes the receiving compartments. The fastener post structure can be removed from the receiving compartment using a tool for assembling to the first object.

In the above embodiment, one or more pieces of the vibration-proof fastener post structures can be assembled to the first object to form a module, to which the second object can be fastened. The first object can be a board, a plate, a block, a strip or a polygonal body.

In the above embodiment, the neck portion can be movably assembled to the body portion without exposing from the first end of the body portion or the first object.

In the above embodiment, a length of the neck portion upward projected beyond the body portion can be partially or completely assembled to the fastening head portion.

In the above embodiment, the connecting section of the body portion can be connected to the first object by way of riveting, expanded connection, snap-on fastening, welding, glue bonding or magnetic fastening.

In the above embodiment, the fastening head portion can include a pressing section.

In the above embodiment, the connecting section can be a stepped section, a threaded section, a recessed section, a raised section, a cambered surface, a flat surface, a curved surface or a beveled surface In the above embodiment, the connecting section can be connected to the first object by riveting, screw-fastening, expanded connection, welding, glue bonding, SMT (surface mount technology) soldering or snap-on fastening.

In the above embodiment, the fastening head portion can be located outside or inside the pushing member.

In summary, according to the vibration-proof fastener post structure of the present invention, the first end of the body portion can be integrally formed with or assembled to a first object; and the neck portion can be extended into a slideway hole on a second object, so that the second object is slidable relative to the neck portion to a predetermined position. When the second object is slid to the predetermined position, the elastic element can act directly on the fastening head portion or indirectly via the body portion or the pushing member, bringing the fastening head portion to engage with a selected point of the slideway hole and fasten the second object to the first object in a vibration-proof manner. Therefore, the shortcomings of the conventional fastening elements can be overcome.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 16 illustrates sectional views showing the fastener post structure according to a fifth preferred embodiment of the present invention in use;

DETAILED DESCRIPTION OF THE PREFERRED EMBODIMENTS

Figure 1:
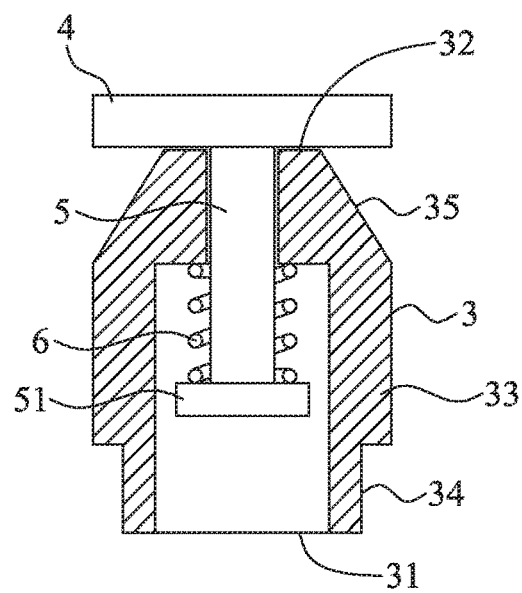
FIG. 1 is a sectional view of a vibration-proof fastener post structure according to a first preferred embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 2:
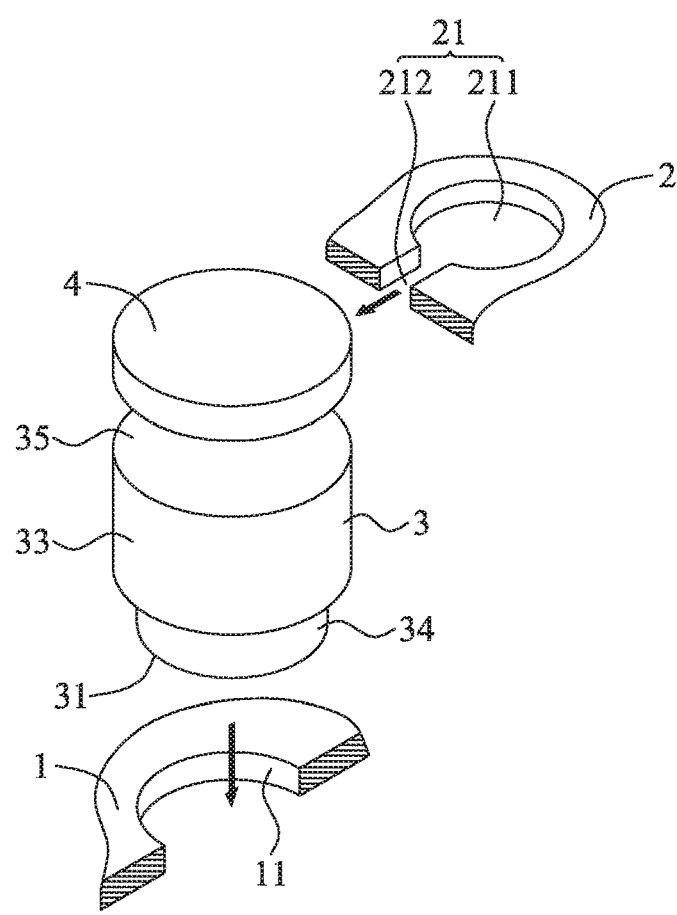
FIG. 2 is a perspective view of the fastener post structure of FIG. 1 to be connected to between a first object and a second object.
Figure 3A:
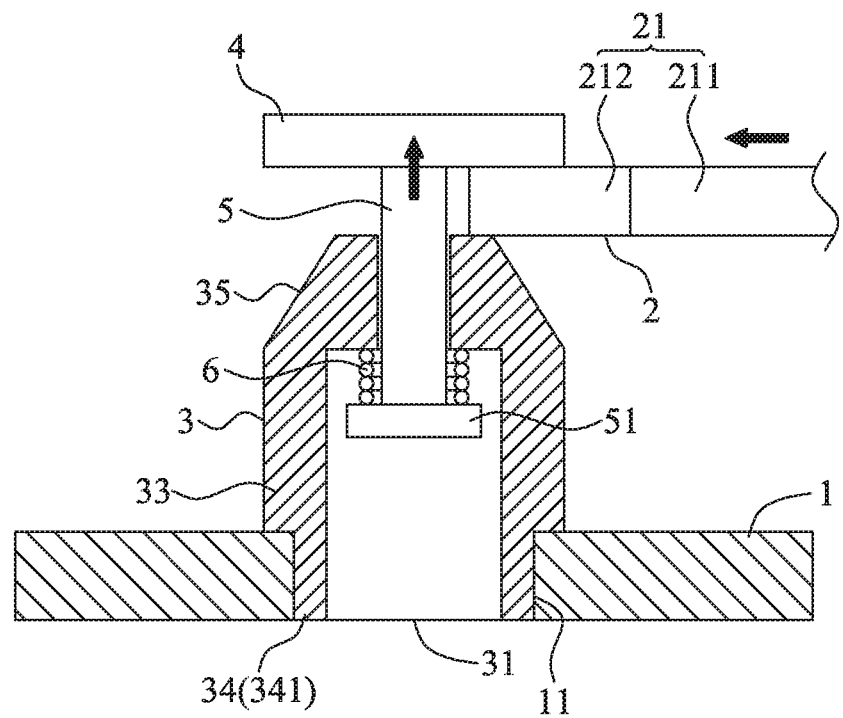
FIG. 3A shows the second object connected to the fastener post structure of FIG. 2 can be slid relative to a neck portion of the fastener post structure.
Figure 3B:
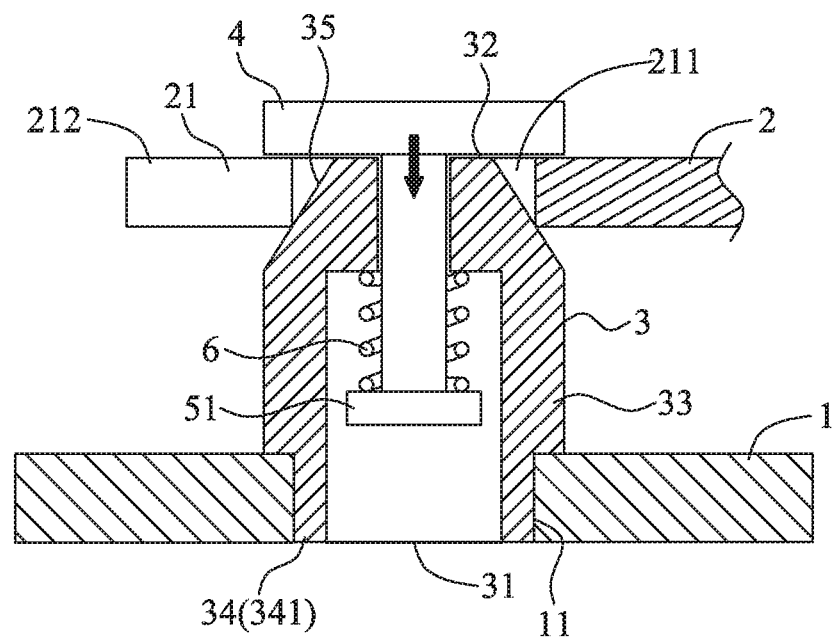
FIG. 3B shows a fastening head portion and a body portion of the fastener post structure of FIG. 2 engaged with a slideway hole on the second object.

Please refer to FIGS. 1 and 2. The present invention provides a vibration-proof fastener post structure having an end for fixedly connecting to a first object 1, such as a circuit board, a substrate, a chassis and the like, and another end for slidably connecting to a second object 2, such as a circuit board, a substrate, a chassis and the like. The vibration-proof fastener post structure according to the present invention is characterized in that the other end thereof can be located in and engaged with a slideway hole 21 on the second object 2 when it is slid to a predetermined position on the second object 2. According to a first preferred embodiment of the present invention, the vibration-proof fastener post structure includes a body portion 3, a fastening head portion 4 and an elastic element 6. The body portion 3 has a first end 31 integrally formed with or assembled to the first object 1. The fastening head portion 4 is movably mounted to a second end 32 of the body portion 3, and has a neck portion 5 movably located in the body portion 3. More specifically, the neck portion 5 is movably disposed in the body portion 3 without exposing from the first end 31 of the body portion 3 or from the first object 1, such that the neck portion 5 can be moved in along the slideway hole 21 of the second object 2. The elastic element 6 is movably fitted around the neck portion 5 with an end pushing against the body portion 3 and another end pushing against a stopper 51 formed at an end of the neck portion 5 opposite to the fastening head portion 4. The stopper 51 can be a disk, a ring, a block or a flat piece having a sectional size larger than that of the neck portion 5. Further, the stopper 51 can be integrally formed with or assembled to the neck portion 5. As can be seen in FIGS. 2 and 3A, after the body portion 3 is connected to the first object 1, the neck portion 5 can be moved in along the slideway hole 21 of the second object 2. When the neck portion 5 has been moved to a predetermined position, as shown in FIG. 3B, the elastic element 6 can elastically pull the fastening head portion 4 downward, bringing the fastening head portion 4 and the body portion 3 to engage with the slideway hole 21 of the second object 2 and be fastened thereto to form a structure fastened to the second object 2 in a vibration-proof manner.

Figure 4:
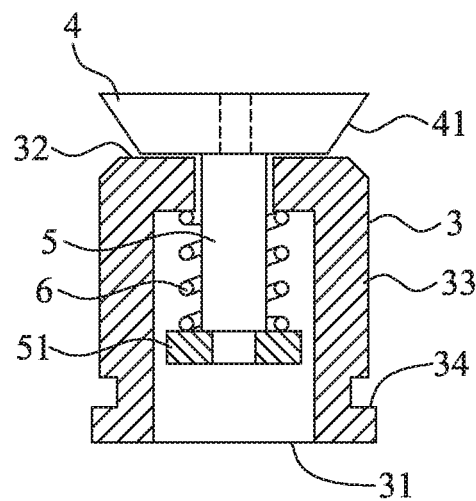
FIG. 4 is a sectional view of the vibration-proof fastener post structure according to a second preferred embodiment of the present invention.

As can be seen in FIG. 1, the body portion 3 can be a hollow sleeve 33, the first end of which is a connecting section 34 for connecting to a fixing hole 11 on the first object 1 (see FIG. 2). The connecting section 34 can be connected to the fixing hole 11 by way of welding 341 (see FIG. 3A or 23C), snap-on fastening 342 (see FIG. 6A), riveting 343 (see FIG. 7), screwing 344 (see FIG. 11), expanded connection 345 (see FIG. 12), glue bonding (not shown), or magnetic fastening (not shown). The fastening head portion 4 and the neck portion 5 can be integrally formed with each other, as shown in FIG. 1, or be assembled to each other, as shown in FIG. 4. For example, a length of the neck portion 5 upward projected beyond the body portion 3 (i.e. the sleeve 33) can be partially or completely integrally formed with or assembled to the fastening head portion 4, as shown in FIG. 4, such that the end of the neck portion 5 having the stopper 51 is located in the sleeve 33 and the fastening head portion 4 is located adjacent to the second end 32 of the body portion 3, i.e. the sleeve 33. The stopper 51 can be integrally formed with the neck portion 5, as shown in FIG. 1, or be assembled to the neck portion 5, as shown in FIG. 4. The elastic element 6 is preferably a coil spring, a flat spring, a bar-shaped elastic body or any other suitably shaped elastic body, and is fitted around a section of the neck portion 5 that is located in the sleeve 33, so as to enable an engaging and shock-absorbing function between the fastening head portion 4 and the second end 32 of the body portion 3. Further, the elastic element 6 can be made of a metal material, a plastic material, a rubber material or a silicon material.

Figure 5:
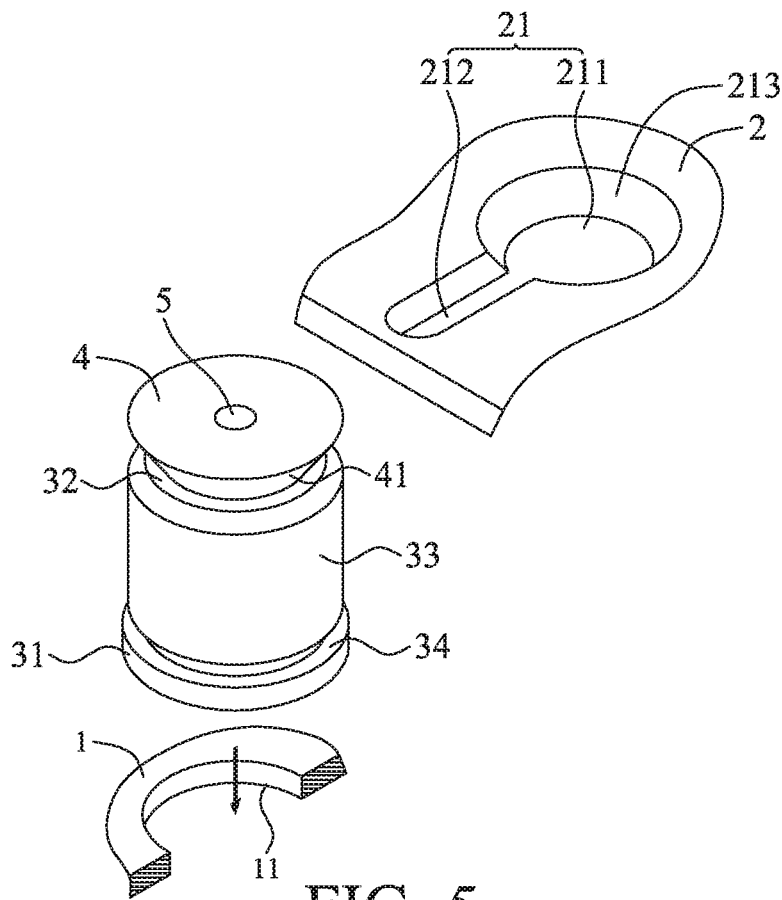
FIG. 5 is a perspective view of the fastener post structure of FIG. 4 to be connected to between a first object and a second object.
Figure 6A:
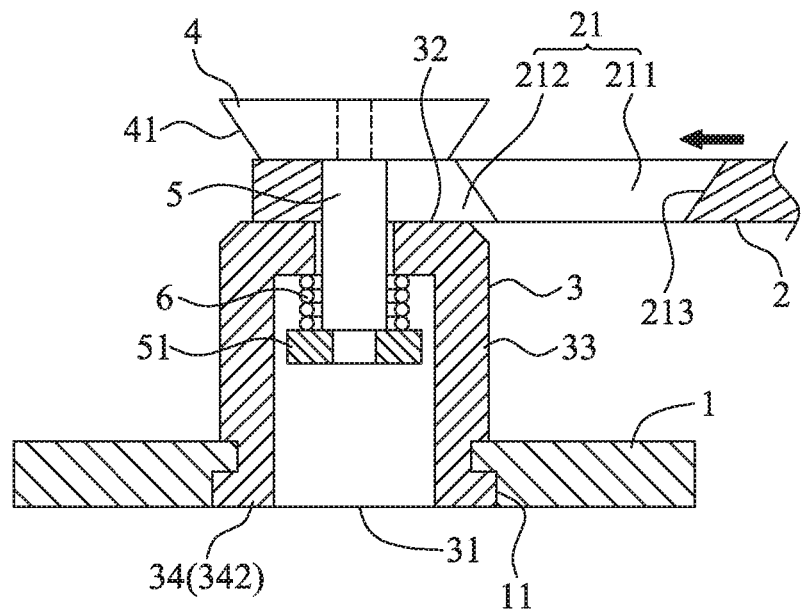
FIG. 6A shows the second object connected to the fastener post structure of FIG. 5 can be slid relative to a neck portion of the fastener post structure.
Figure 6B:
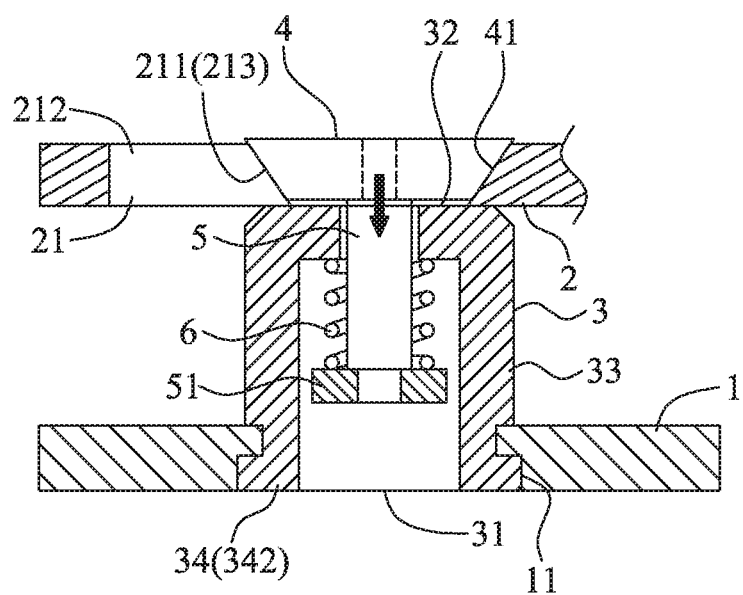
FIG. 6B shows a fastening head portion and a body portion of the fastener post structure of FIG. 5 engaged with a slideway hole on the second object.
Figure 7:
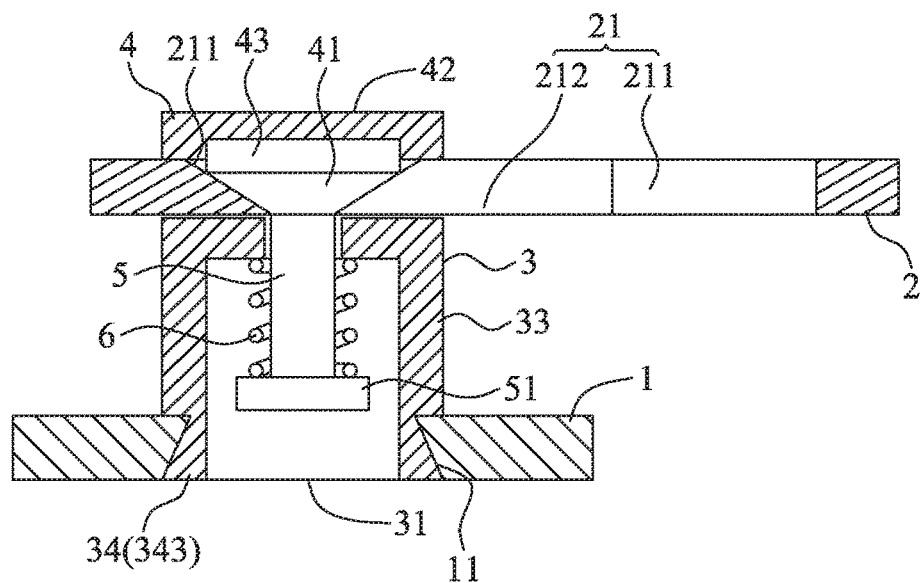
FIG. 7 is a sectional view of the vibration-proof fastener post structure according to a third preferred embodiment of the present invention.
Figure 8:
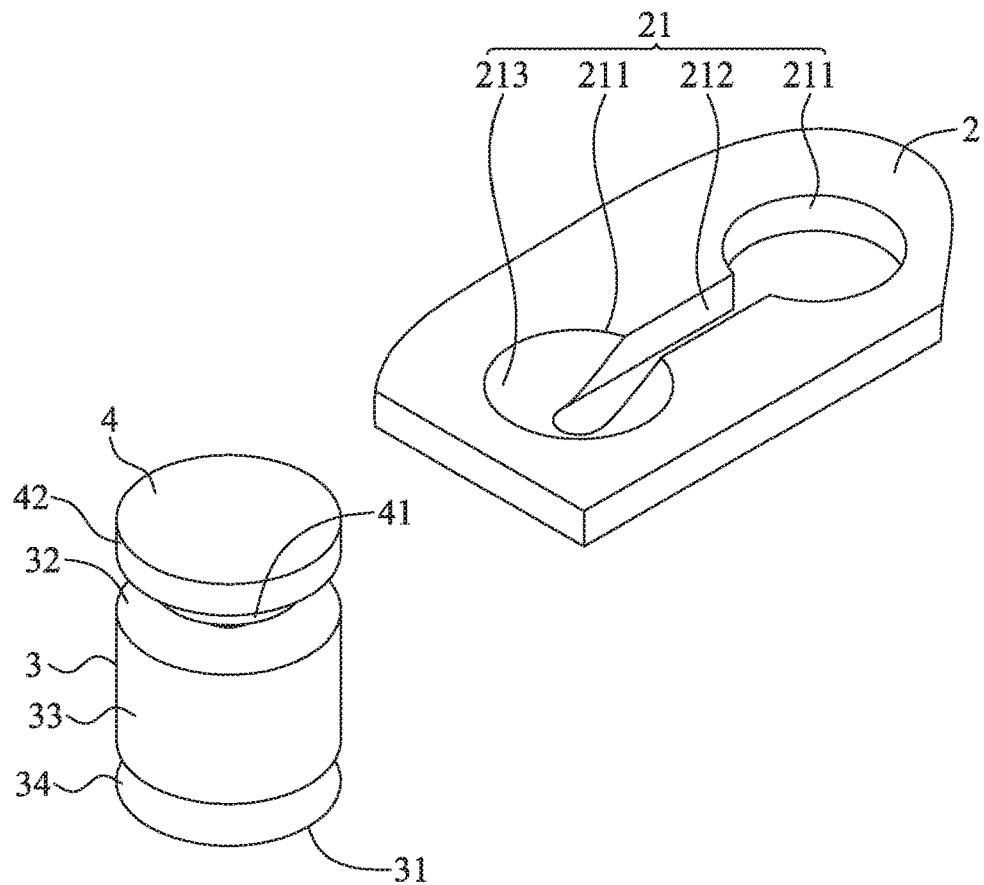
FIG. 8 is a perspective view of the fastener post structure of FIG. 7 to be connected to between a first object and a second object.

Please refer to FIGS. 1 and 2 again. In the first preferred embodiment, the second end 32 of the body portion 3 (i.e. the sleeve 33) has an outer peripheral surface formed into a first guide surface 35 to face toward the second object 2, such that the second end 32 is tapered in shape. When the neck portion 5 is being moved in along the slideway hole 21 of the second object 2 to the predetermined position, as shown in FIGS. 3A and 3B, the first beveled guide surface 35 allows the sleeve 33 to be more easily moved relative to the second object 2 to engage with the slideway hole 21 of the second object 2. As can be seen in FIGS. 4 and 5, according to a second preferred embodiment of the present invention, the fastening head portion 4 can be provided with a second beveled guide surface 41 facing toward the second object 2, such that the fastening head portion 4 has a tapered outer peripheral surface. When the neck portion 5 is being moved in along the slideway hole 21 of the second object 2 to the predetermined position, as shown in FIGS. 6A and 6B, the second beveled guide surface 41 allows the fastening head portion 4 to be more easily moved relative to the second object 2 to engage with the slideway hole 21 of the second object 2. According to a third preferred embodiment of the present invention, as shown in FIGS. 7 and 8, the fastening head portion 4 can include a handling portion 42, a protruded stop portion 43 located at one side of the handling portion 42 and facing toward the second object 2, and a second beveled guide surface 41 formed on around the protruded stop portion 43, such that an end of the protruded stop portion 43 facing toward the second object 2 is tapered in shape. The handling portion 42 can be in the form of a round cap having an outer diameter larger than a hole portion 211 of the slideway hole 21, such that the handling portion 42 is stopped from passing through the hole portion 211 and located outside the hole portion 211. The protruded stop portion 43 can be a cylindrical body.

Figure 9A:
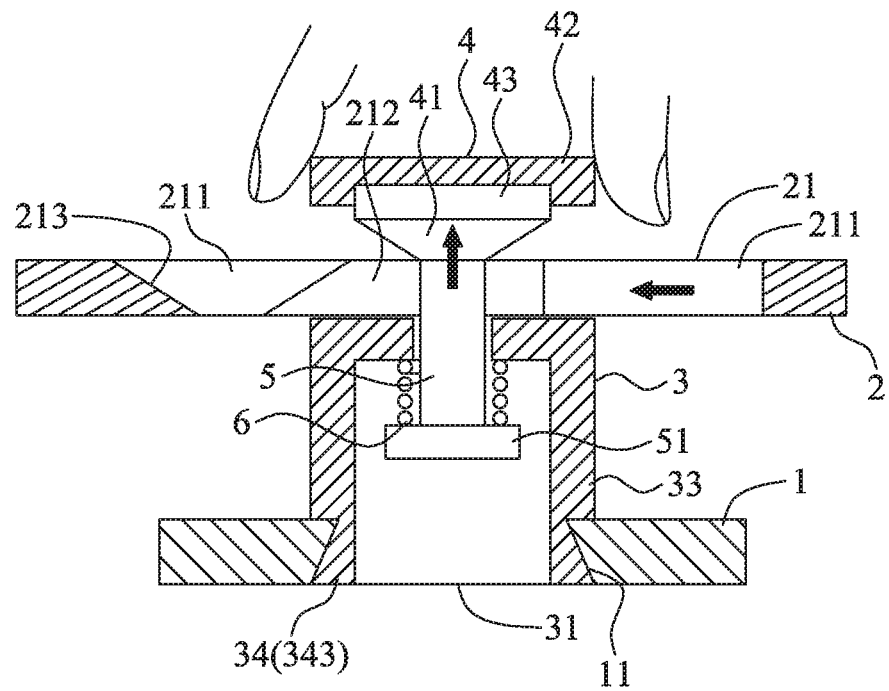
FIG. 9A shows the second object connected to the fastener post structure of FIG. 8 can be slid relative to a neck portion of the fastener post structure.
Figure 9B:
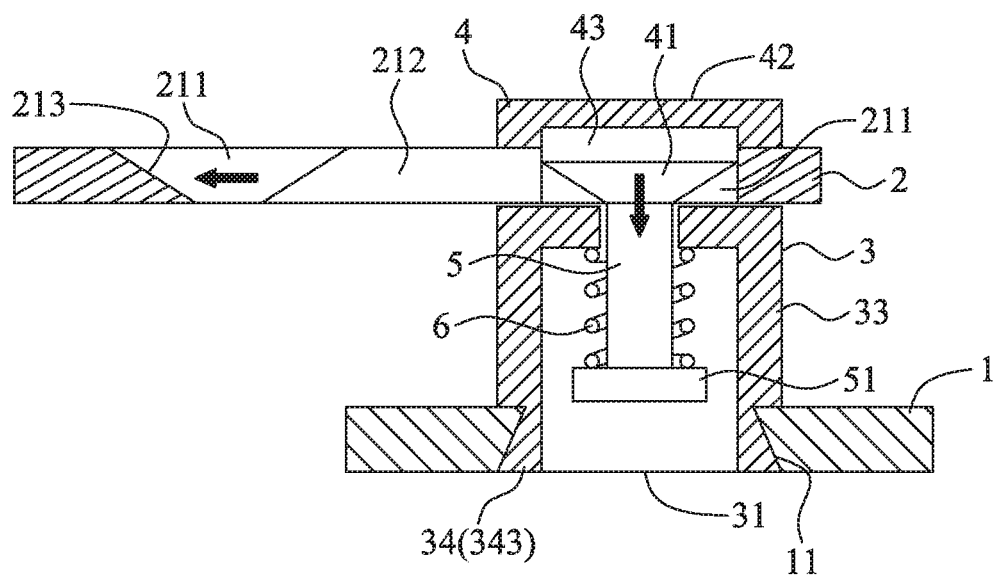
FIG. 9B shows a fastening head portion and a body portion of the fastener post structure of FIG. 8 engaged with a slideway hole on the second object.
Figure 10A:
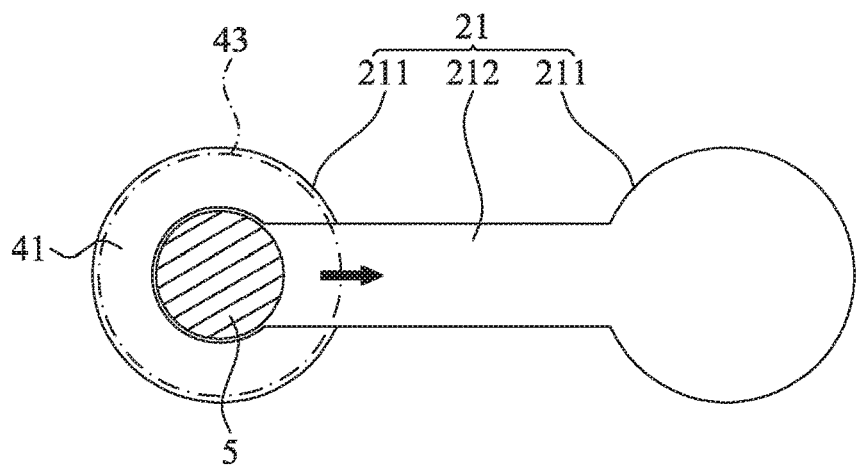
FIG. 10A shows the second object connected to the fastener post structure of FIG. 8 can be slid relative to a neck portion of the fastener post structure.
Figure 10B:
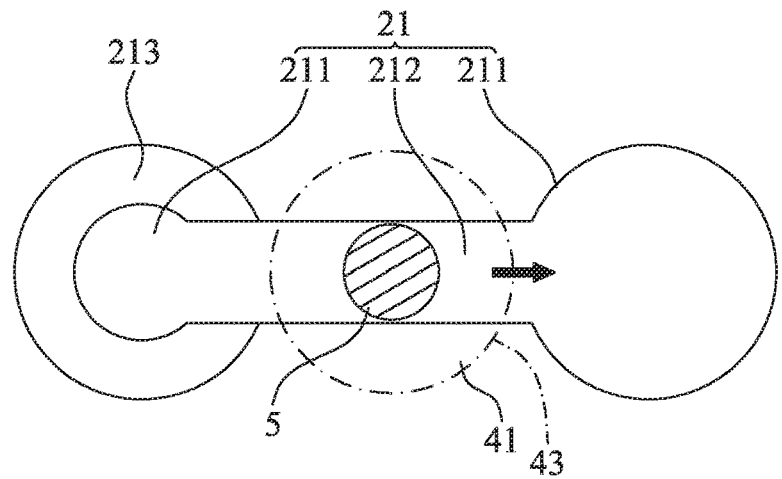
FIG. 10B shows the second object connected to the fastener post structure of FIG. 8 can be slid relative to a neck portion of the fastener post structure.
Figure 10C:
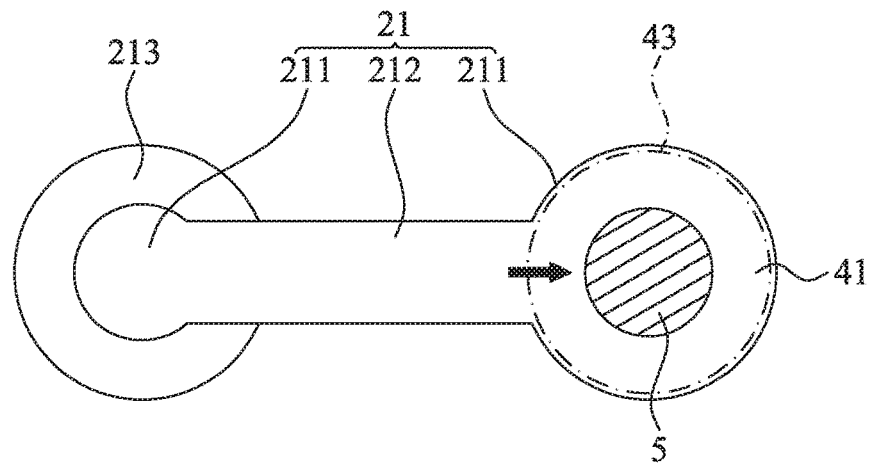
FIG. 10C shows the second object connected to the fastener post structure of FIG. 8 can be slid relative to a neck portion of the fastener post structure.
Figure 11:
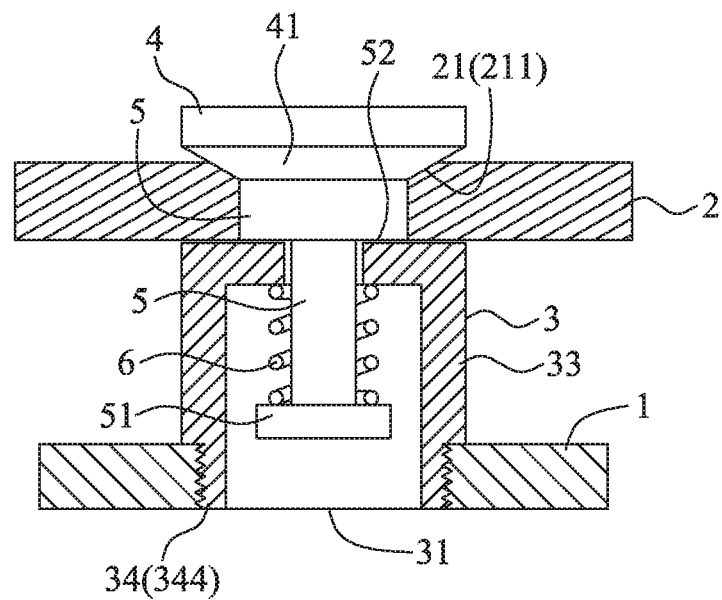
FIG. 11 is a sectional view of the vibration-proof fastener post structure according to a fourth preferred embodiment of the present invention, of which a neck portion includes a shoulder portion.

The handling portion 42 and the protruded stop portion 43 can be integrally formed with or assembled to each other. The second beveled guide surface 41 allows the fastening head portion 4 to be more easily moved relative to the second object 2. When the neck portion 5 is moved along the slideway hole 21 of the second object 2 into the hole portion 211, and when the hole portion 211 is a straight-wall hole as shown in FIGS. 9A and 9B as well as in FIGS. 10A to 10C, the protruded stop portion 43 along with the second beveled guide surface 41 will engage with the straight-wall hole portion 211 of the slideway hole 21 of the second object 2. At this point, an inner wall surface of the straight-wall hole portion 211 is in contact with an outer wall of the protruded stop portion 43 to restrict the latter from moving to thereby achieve a fastening effect. According to a fourth preferred embodiment of the present invention as shown in FIG. 11, the neck portion 5 can have a diametrically expanded shoulder portion 52, which can be integrally formed with or assembled to the fastening head portion 4. The shoulder portion 52 is abutted on the second end 32 of the body portion 3, i.e. the sleeve 33, to keep the fastening head portion 4 away from the body portion 3 by a distance. With this arrangement, the fastening head portion 4 can be more easily moved relative to the second object 2 to engage with the hole portion 211. In a variation of the fourth preferred embodiment, the neck portion 5 can be integrally formed with the body portion 3 as shown in FIGS. 13 and 14, or be extended into and assembled to the body portion 3.

As can be seen in FIGS. 2 and 3A, according to the first preferred embodiment of the present invention, the slideway hole 21 of the second object 2 preferably includes a hole portion 211 and a sliding slot 212 communicable with the hole portion 211. The hole portion 211 can be a straight-wall hole, which internally defines a bore perpendicular to the surface of the second object 2. In this case, when the neck portion 5 is moved through the sliding slot 212 into the straight-wall hole portion 211, the elastic element 6 will exert an elastic force on the stopper 51 of the neck portion 5, such that the fastening head portion 4 and the body portion 3 are tightly fastened to the hole portion 211. On the other hand, as can be seen in FIGS. 8 and 10A to 10C, according to the third preferred embodiment of the present invention, the slideway hole 21 of the second object 2 can include two or more hole portions 211 and a sliding slot 212 communicating with each of the hole portions 211. In this case, when the neck portion 5 is moved through the sliding slot 212, the fastening head portion 4 and the body portion 3 can engage with any one of the hole portions 211. Also, according to the second preferred embodiment as shown in FIGS. 5 and 6A, and according to the third preferred embodiment as shown in FIG. 8, the hole portion 211 of the slideway hole 21 can preferably include a beveled guide surface 213, such that the hole portion 211 is a conical-wall hole. With the beveled guide surface 213 and the first beveled guide surface 35 or the second beveled guide surface 41, the fastening head portion 4 can more precisely engage with the slideway hole 21 of the second object 2.

Alternatively, as shown in FIG. 5, when the fastening head portion 4 in the hole portion 211 is slid into the sliding slot 212 with the neck portion 5 disposed in the sliding slot 212, the elastic element 6 can also exert its elastic force on the neck portion 5, bringing the fastening head portion 4 and the body portion 3 to engage with the sliding slot 212.

Figure 13:
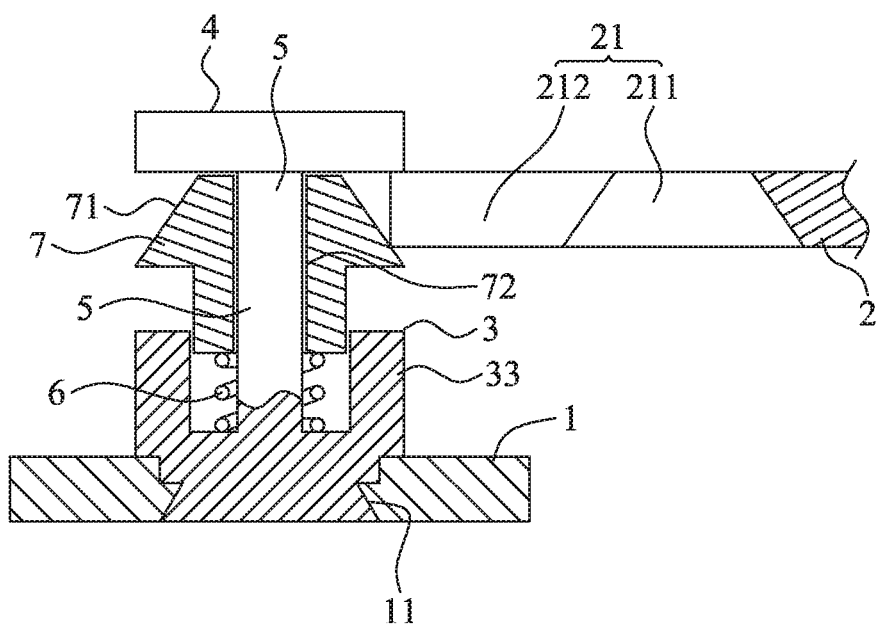
FIG. 13 is a sectional view of the vibration-proof fastener post structure according to a variation of the fourth preferred embodiment of the present invention, which includes a pushing member.
Figure 14:
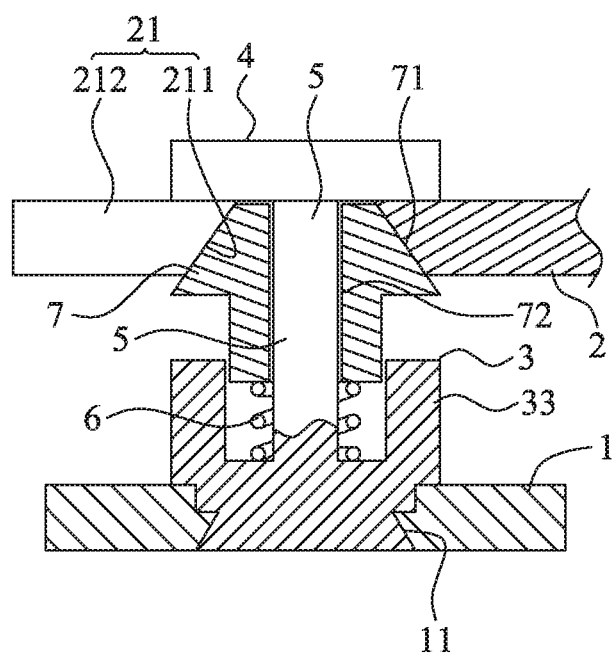
FIG. 14 is a sectional view showing the fastener post structure of FIG. 13 is connected to between a first object and a second object.

The variation of the fourth preferred embodiment illustrated in FIGS. 13 and 14 includes a body portion 3 having a first end 31 integrally formed with or assembled to the first object 1; a pushing member 7 movably disposed at a second end 32 of the body portion 3; a fastening head portion 4 movably located at an end of the pushing member 7 and having a neck portion 5, which is extended through the pushing member 7 and located in the body portion 3 to be movable in the slideway hole 21 of the second object 2; and an elastic element 6 fitted around the neck portion 5 with an end pressing against the pushing member 7 and another end pressing against the body portion 3 located adjacent to an end of the neck portion 5. As can be seen in FIG. 13, after the body portion 3 is connected to the first object 1, the neck portion 5 can be moved in along the slideway hole 21 of the second object 2. On the other hand, when the neck portion 5 has been moved to a predetermined position in the slideway hole 21, as shown in FIG. 14, the elastic element 6 can elastically act on the fastening head portion 4 and the pushing member 7 for them to engage with the slideway hole 21 of the second object 2 and be fastened thereto to form a structure fastened to the second object 2 in a vibration-proof manner.

Figure 15A:
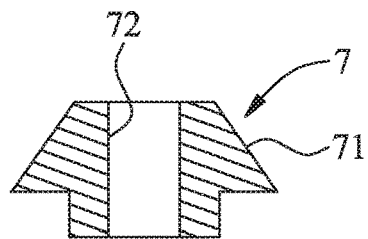
FIG. 15A is a sectional view of some other preferred embodiments of the pushing member of FIG. 13.
Figure 15B:
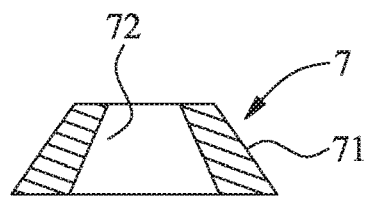
FIG. 15B is a sectional view of some other preferred embodiments of the pushing member of FIG. 13.
Figure 15C:
FIG. 15C is a sectional view of some other preferred embodiments of the pushing member of FIG. 13.
Figure 15D:
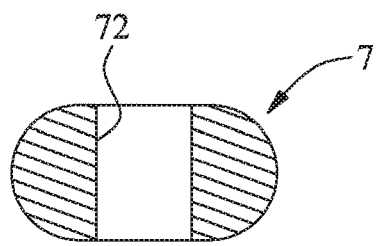
FIG. 15D is a sectional view of some other preferred embodiments of the pushing member of FIG. 13.
Figure 15E:
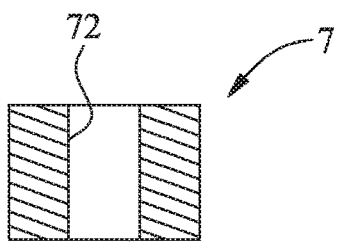
FIG. 15E is a sectional view of some other preferred embodiments of the pushing member of FIG. 13.

In the above variation of the fourth preferred embodiment, the pushing member 7 can include a third beveled guide surface 71, so that an end of the pushing member 7 is tapered. When the neck portion 5 is moved through the sliding slot 212 of the slideway hole 21 (see FIG. 13) into the hole portion 211, the third beveled guide surface 71 is brought to engage with the hole portion 211 of the slideway hole 21 (see FIG. 14). According to the present invention, the pushing member 7 can be optionally configured as a conical body having an axial bore 72, as shown in FIGS. 15A and 15B; a flat body having an axial bore 72, as shown in FIG. 15C; a ball-shaped body having an axial bore 72, as shown in FIG. 15D; an oblong body having an axial bore 72; or a bar-shaped body having an axial bore 72, as shown in FIG. 15E. The neck portion 5 is extended through the axial bore 72 to thereby form the vibration-proof fastener post structure of the present invention. Since the first object 1, the second object 2, the slideway hole 21 and the body portion 3 in the illustrated fourth preferred embodiment and the variation thereof are structurally similar to those in the first preferred embodiment, they are not repeatedly described herein.

Please refer to FIG. 16, in which the vibration-proof fastener post structure according to a fifth preferred embodiment of the present invention is shown. The fifth preferred embodiment is different from the variation of the fourth preferred embodiment in the arrangement of the elastic element 6. In the variation of the fourth preferred embodiment shown in FIGS. 13 and 14, the other end of the elastic element 6 is pressed against an inner side of the body portion 3. However, in the fifth preferred embodiment shown in FIG. 16, the other end of the elastic element 6 is pressed against an outer side of the body portion 3. Since the first object 1, the second object 2, the slideway hole 21 and the body portion 3 in the illustrated fifth preferred embodiment are structurally similar to those in the first preferred embodiment, they are not repeatedly described herein.

Figure 17:
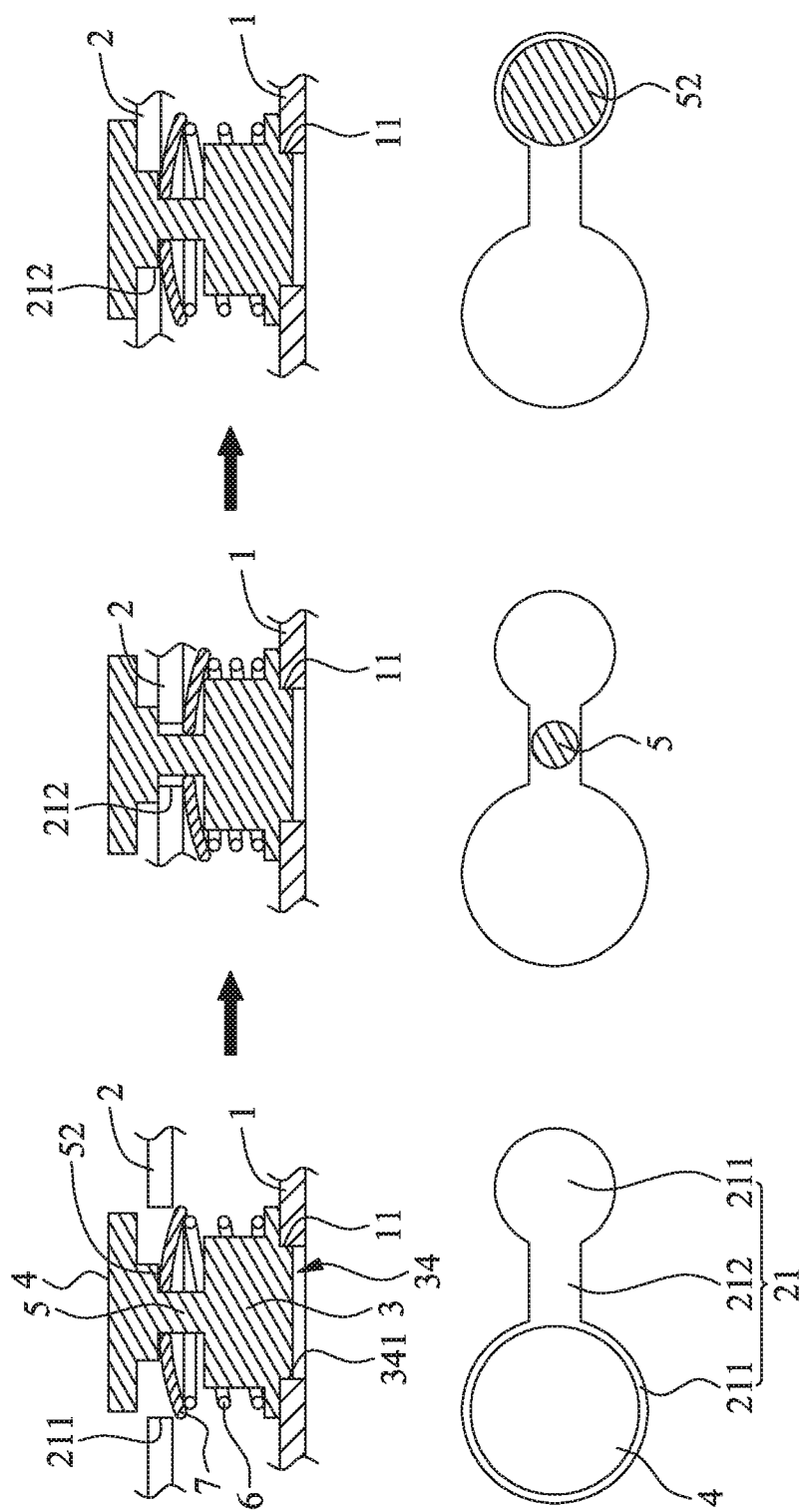
FIG. 17 illustrates sectional views showing the fastener post structure according to a sixth preferred embodiment of the present invention in use.

Please refer to FIG. 17, in which the vibration-proof fastener post structure according to a sixth preferred embodiment of the present invention is shown. The sixth preferred embodiment is different from the fifth preferred embodiment in the arrangement of the pushing member 7. In the sixth preferred embodiment shown in FIG. 17, the neck portion 5 includes a shoulder portion 52 located between the neck portion 5 and the fastening head portion 4, and the pushing member 7 is pushing against a lower side of the shoulder portion 52. However, in the fifth preferred embodiment shown in FIG. 16, the pushing member 7 is pushing against a lower side of the fastening head portion 4. The vibration-proof fastener post structure in the sixth preferred embodiment shown in FIG. 17 can be applied to a second object 2 that has a slideway hole 21 including a larger hole portion 211, a sliding slot 212 and a small hole portion 211, which are communicable with one another. To use the vibration-proof fastener post structure of the sixth preferred embodiment, first fit the larger hole portion 211 around the vibration-proof fastener post structure below the fastening head portion 4 thereof; and then, slide the sliding slot 212 toward the vibration-proof fastener post structure. At this point, since the sliding slot 212 has a width larger than the neck portion 5 but smaller than the shoulder portion 52, the sliding slot 212 will be located around the neck portion 5 and is slidably limited between the shoulder portion 52 and the elastic element 6. Thereafter, slide the smaller hole portion 211 toward the vibration-proof fastener post structure. At this point, since the smaller hole portion 211 is larger than the shoulder portion 52 but smaller than the fastening head portion 4, the smaller hole portion 211 will be located around the shoulder portion 52 and fastened to between the fastening head portion 4 and the elastic element 6.

Figure 18:
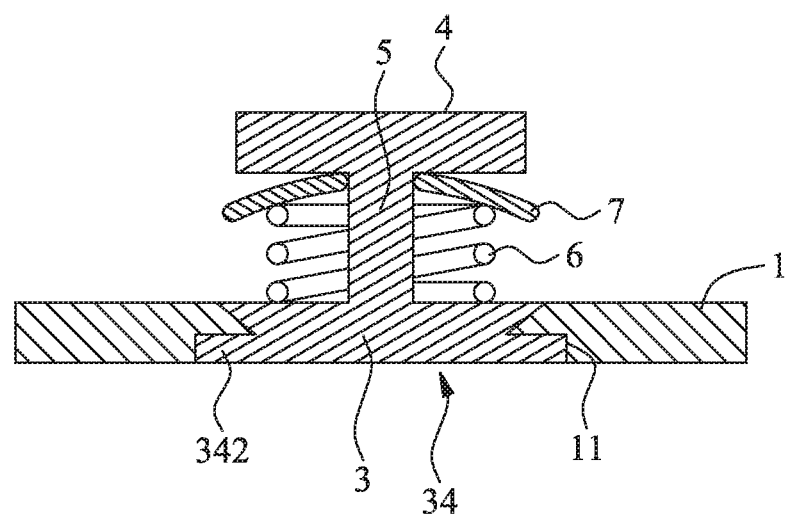
FIG. 18 is a sectional view of the fastener post structure according to a seventh preferred embodiment of the present invention.

Please refer to FIG. 18, in which the vibration-proof fastener post structure according to a seventh preferred embodiment of the present invention is shown. The seventh preferred embodiment is different from the fifth preferred embodiment in the configuration of the body portion 3 and the arrangement of the elastic element 6. In the seventh preferred embodiment shown in FIG. 18, the body portion 3 is in the form of a flat body, and the other end of the elastic element 6 is pressed against an upper side of the body portion 3. However, in the fifth preferred embodiment in FIG. 16, the other end of the elastic element 6 pressed against the outer side of the body portion 3. Since the first object 1, the second object 2, the slideway hole 21 and the body portion 3 in the seventh preferred embodiment are structurally similar to those in the first preferred embodiment, they are not repeatedly described herein.

Figure 19:
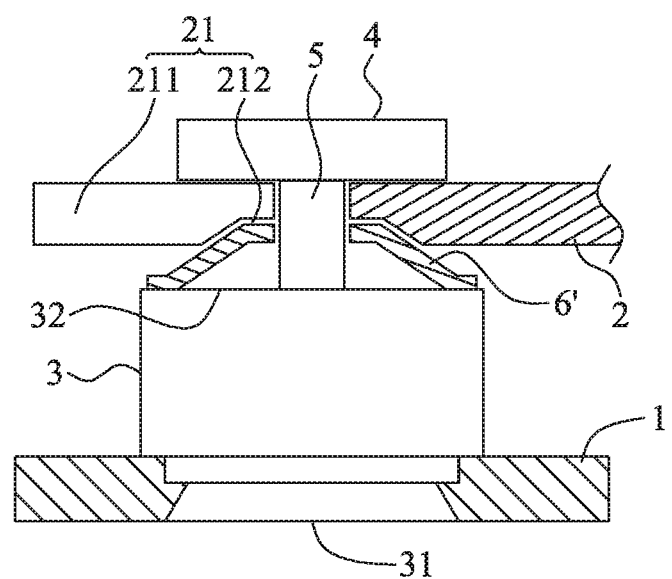
FIG. 19 is a sectional view of the fastener post structure according to an eighth preferred embodiment of the present invention, which includes an elastic element for directly engaging with the slideway hole of the second object.
Figure 20:
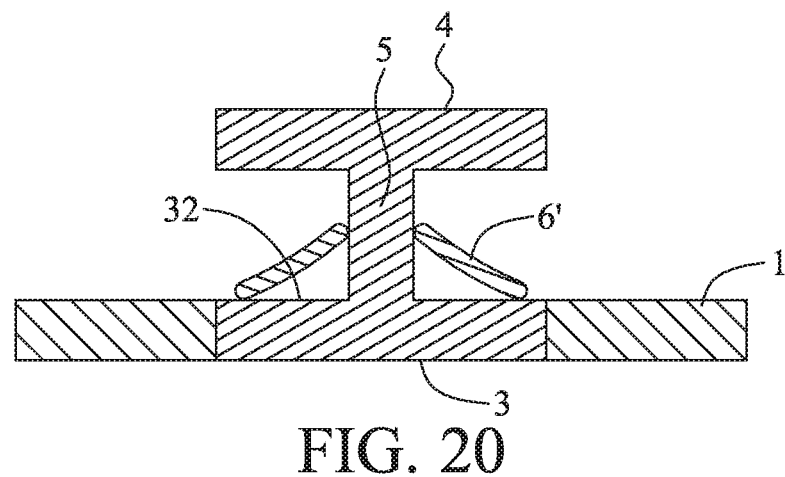
FIG. 20 is a sectional view illustrating the vibration-proof fastener post structure according to an operable embodiment of the present invention has neck portion and body portion integrally formed with each other.

Please refer to FIG. 19. The vibration-proof fastener post structure according to an eighth preferred embodiment of the present invention includes a body portion 3, a fastening head portion 4 and an elastic element 6'. The body portion 3 has a first end 31 integrally formed with the first object 1 (see FIG. 22) or assembled to the first object 1. The fastening head portion 4 can be integrally formed with a second end 32 of the body portion 3 (see FIG. 20) or be movably or fixedly assembled to the second end 32 of the body portion 3 and includes a neck portion 5. The neck portion 5 can be integrally formed with the body portion 3, or be movably or fixedly assembled to the body portion 3. Alternatively, the neck portion 5 can be movably disposed on the body portion 3 without exposing from the first end 31 of the body portion 3 or from the first object 1, such that the neck portion 5 is movable in the slideway hole 21 of the second object 2. The elastic element 6' is movably fitted around the neck portion 5 located at the second end 32 of the body portion 3. With these arrangements, the fastening head portion 4 and the elastic element 6' can engage with the slideway hole 21 of the second object 2 to form a structure fastened to the second object 2 in a vibration-proof manner.

Figure 21:
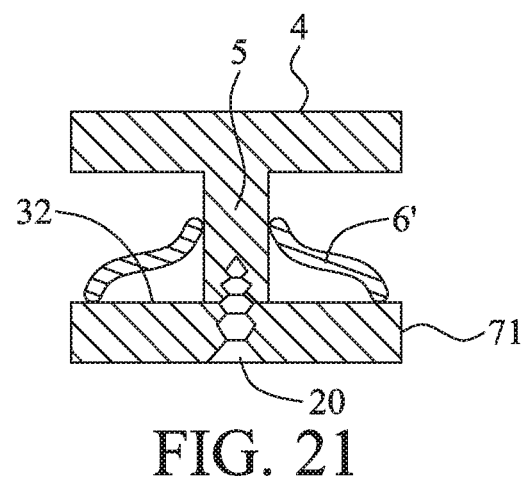
FIG. 21 is a sectional view illustrating the vibration-proof fastener post structure according to an operable embodiment of the present invention has a neck portion fixed to the first object via a connecting element.
Figure 22:
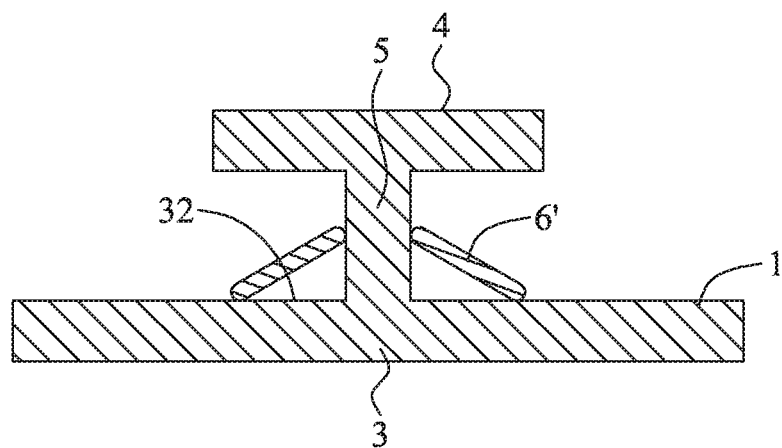
FIG. 22 is a sectional view illustrating the vibration-proof fastener post structure according to an operable embodiment of the present invention has a neck portion integrally formed with the first object.

In a variation of the eighth preferred embodiment, the body portion 3 can be omitted, and the neck portion 5 is fixed to the first object 1 using a connecting element 20, such as a screw, as shown in FIG. 21. Or, in another variation, the neck portion 5 can be integrally formed with the first object 1, as shown in FIG. 22.

Figure 23:
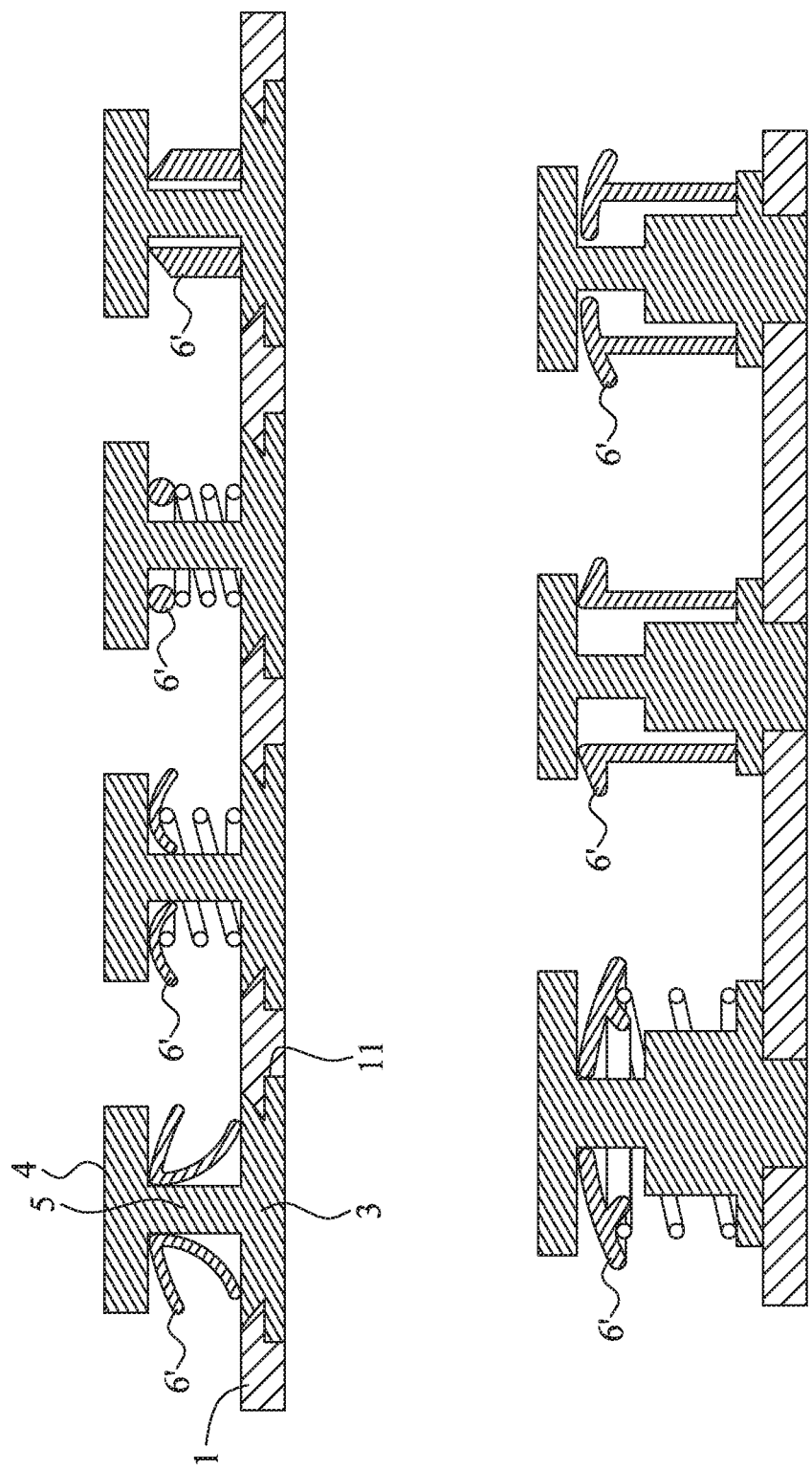
FIG. 23 is a sectional view showing some other preferred embodiments of the elastic element of FIG. 19.

As can be seen in FIG. 23, the elastic element 6' used in the eighth preferred embodiment can be any one of many differently configured hollow springy bodies.

Figure 24A:
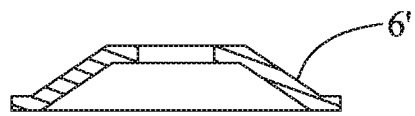
FIG. 24A is other sectional view showing some more preferred embodiments of the elastic element of FIG. 19.
Figure 24B:
FIG. 24B is other sectional view showing some more preferred embodiments of the elastic element of FIG. 19.
Figure 24C:
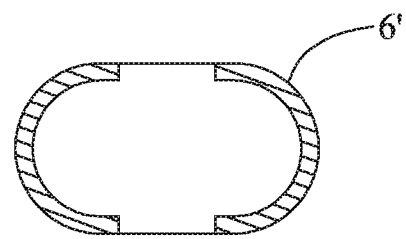
FIG. 24C is other sectional view showing some more preferred embodiments of the elastic element of FIG. 19.
Figure 24D:
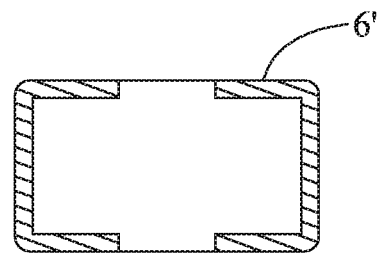
FIG. 24D is other sectional view showing some more preferred embodiments of the elastic element of FIG. 19.
Figure 24E:
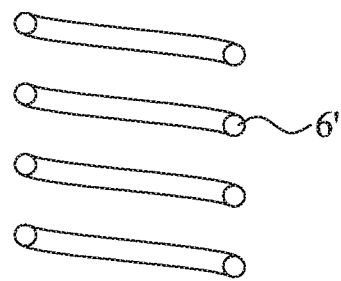
FIG. 24E is other sectional view showing some more preferred embodiments of the elastic element of FIG. 19.
Figure 24F:
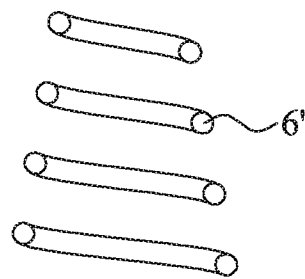
FIG. 24F is other sectional view showing some more preferred embodiments of the elastic element of FIG. 19.
Figure 24G:
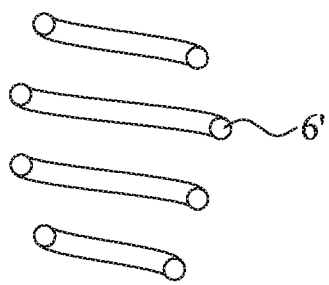
FIG. 24G is other sectional view showing some more preferred embodiments of the elastic element of FIG. 19.
Figure 24H:
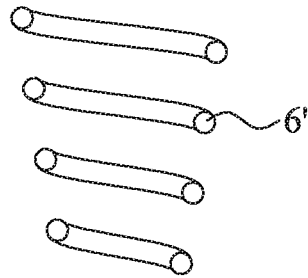
FIG. 24H is other sectional view showing some more preferred embodiments of the elastic element of FIG. 19.
Figure 25:
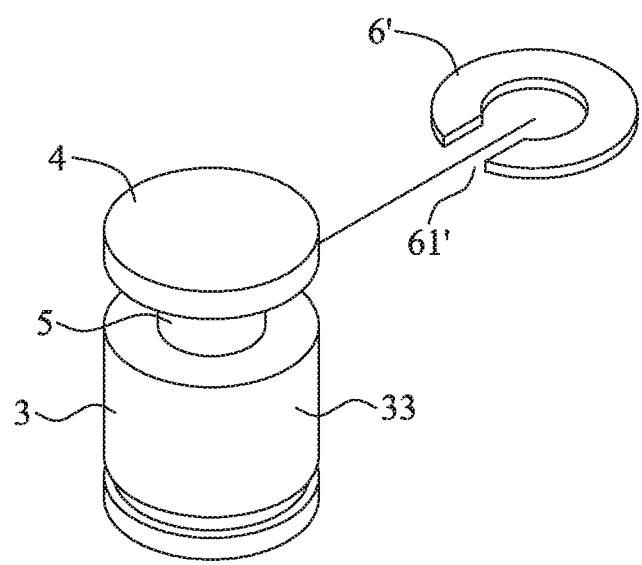
FIG. 25 shows the elastic element includes a cut to facilitate easy assembling of the elastic element to the neck portion.

For example, the elastic element 6' in the eighth preferred embodiment can be in the form of a hollow conical body (see FIGS. 19 and 24A), a hollow corrugated plate (see FIG. 24B), a hollow ball-shaped body (see FIG. 24C), a hollow oblong body, a hollow bar-shaped body (see FIG. 24D), or a hollow helical wire (see FIGS. 24E to 24H). The neck portion 5 is extended through the elastic element 6'. When the neck portion 5 is moved through the sliding slot 212 of the slideway hole 21 into the hole portion 211, the elastic element 6' is brought to engage with the hole portion 211 of the slideway hole 21, as shown in FIG. 19. Further, in the eighth preferred embodiment, the elastic element 6' can include a cut 61', as shown in FIG. 25. The elastic element 6' can be conveniently assembled to the neck portion 5 by forcing the neck portion 5 through the cut 61' of the elastic element 6'.

Figure 26:
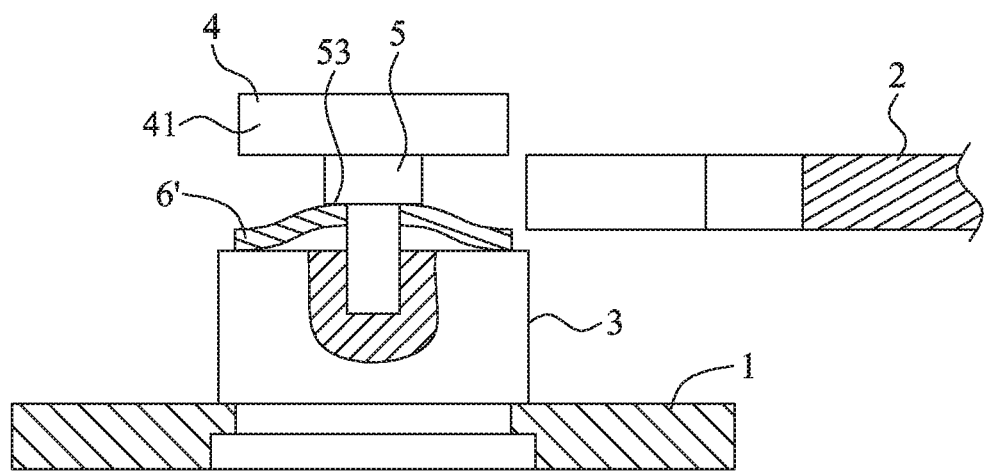
FIG. 26 is a sectional view showing the neck portion includes a second shoulder portion formed at an end thereof and the elastic element is pressed against the second shoulder portion.
Figure 27:
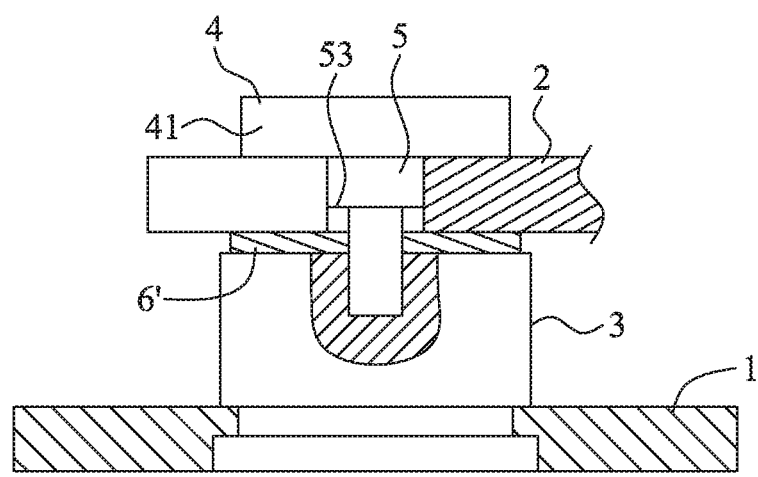
FIG. 27 is a sectional view showing the elastic element of FIG. 26 is pressed against the second object.
Figure 28:
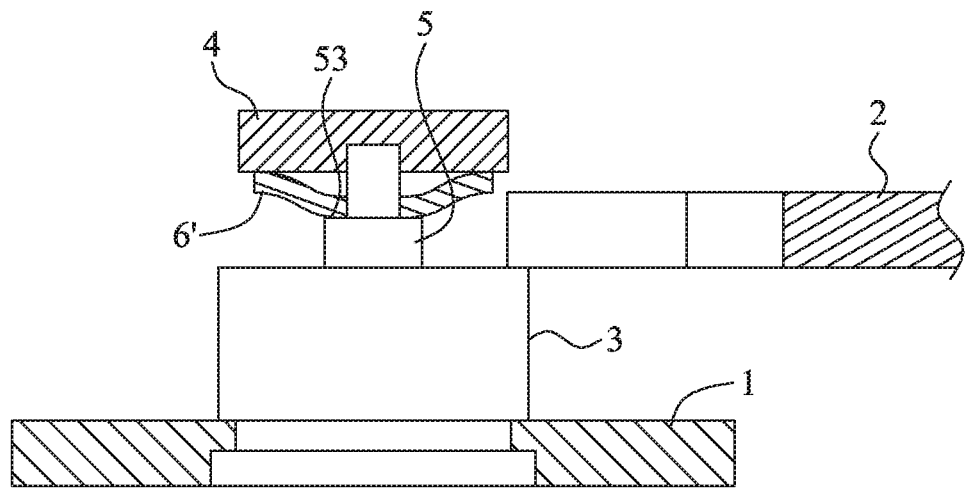
FIG. 28 is a sectional view showing the neck portion includes a second shoulder portion formed at another end thereof and the elastic element is pressed against the second shoulder portion.
Figure 29:
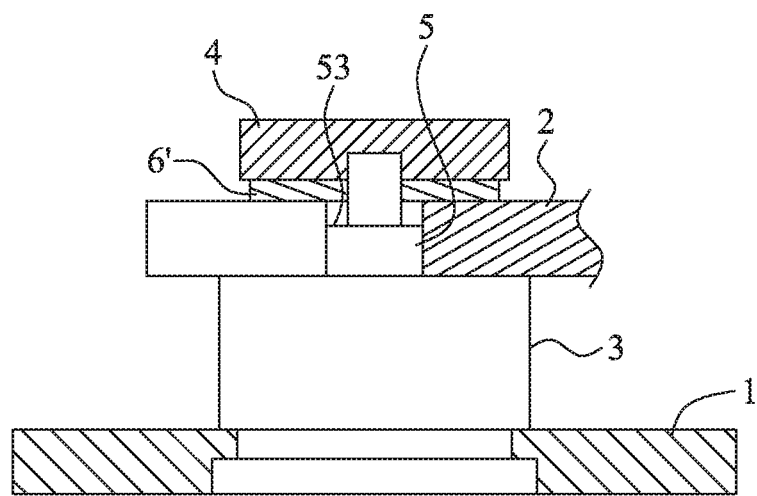
FIG. 29 is a sectional view showing the elastic element of FIG. 28 is pressed against the second object.
Figure 30:
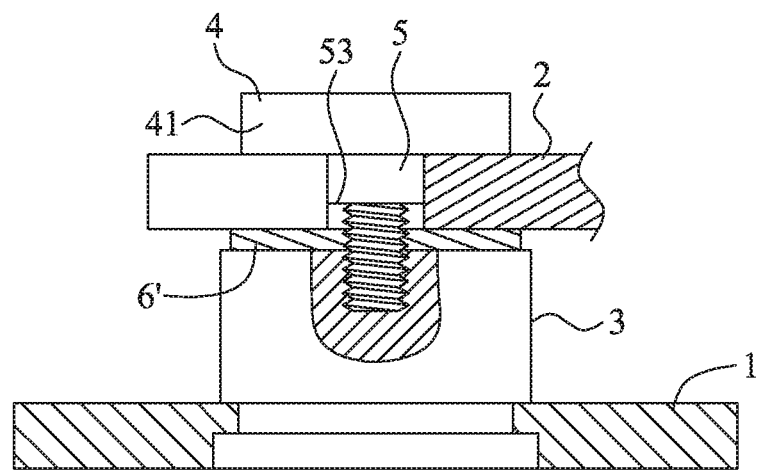
FIG. 30 is a sectional view showing the neck portion and the body portion are assembled to each other by screw fastening.
Figure 31:
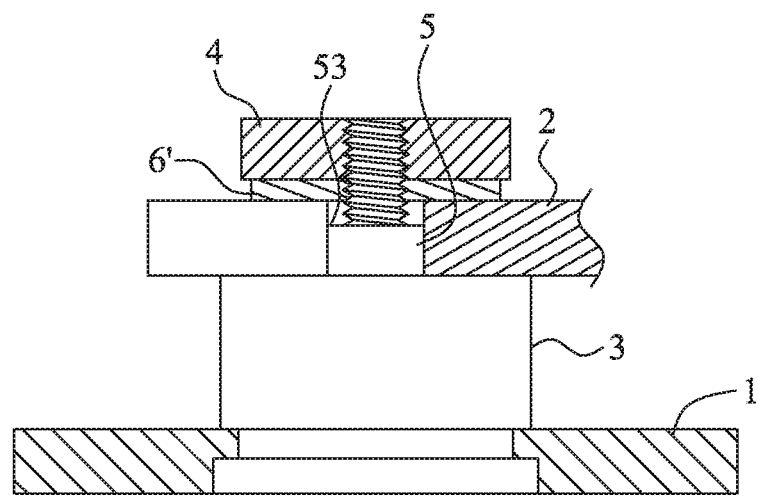
FIG. 31 is a sectional view showing the neck portion and the fastening head portion are assembled to each other by screw fastening.

According to still some other variations of the eighth preferred embodiment, the neck portion 5 can have a diametrically expanded second shoulder portion 53, as can be seen in FIG. 26 or 28. The second shoulder portion 53 has a height smaller than a thickness of the second object 2, and the elastic element 6' has an end stopped by or pressed against the second shoulder portion 53 and is therefore held in place or prevented from shaking upward and downward. The elastic element 6' presses against the second object 2 when the second object 2 engages with the neck portion 5, as can be seen in FIG. 27 or 29. An exact position of the second shoulder portion 53 can be located at an end of the neck portion 5 adjacent to the fastening head portion 4, as shown in FIGS. 26 and 27, or at an end of the neck portion 5 opposite to the fastening head portion 4, as shown in FIGS. 28 and 29. According to some other variations of the eighth preferred embodiment, the neck portion 5 can be connected at an end to the body portion 3 via a screw fastening structure as shown in FIG. 30, and can also be connected at another end to the fastening head portion 4 via a screw fastening structure as shown in FIG. 31.

Figure 32:
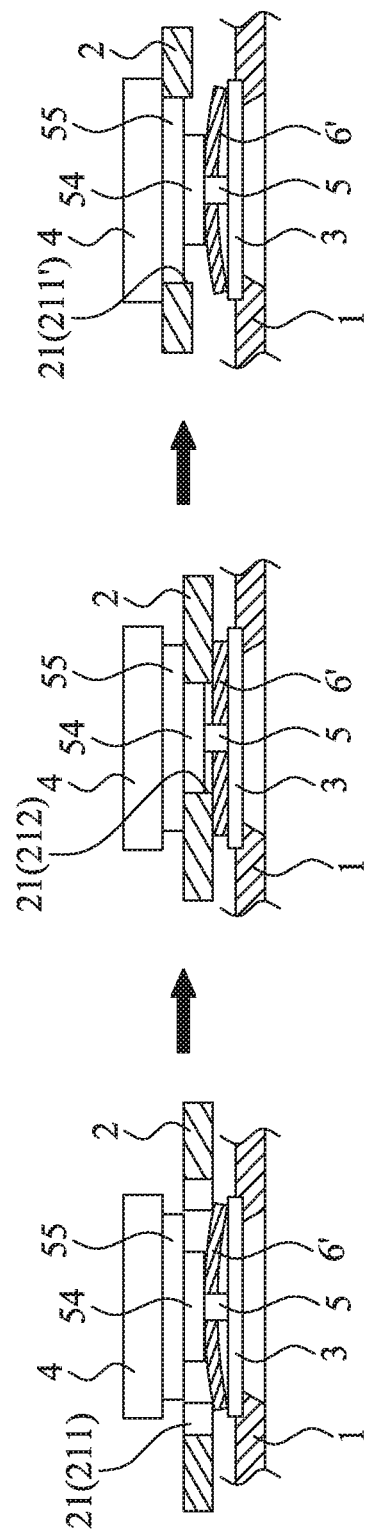
FIG. 32 shows the neck portion includes a first stop portion and a second stop portion, and the two stop portions are slid to engage with the slideway hole of the second object.
Figure 33:
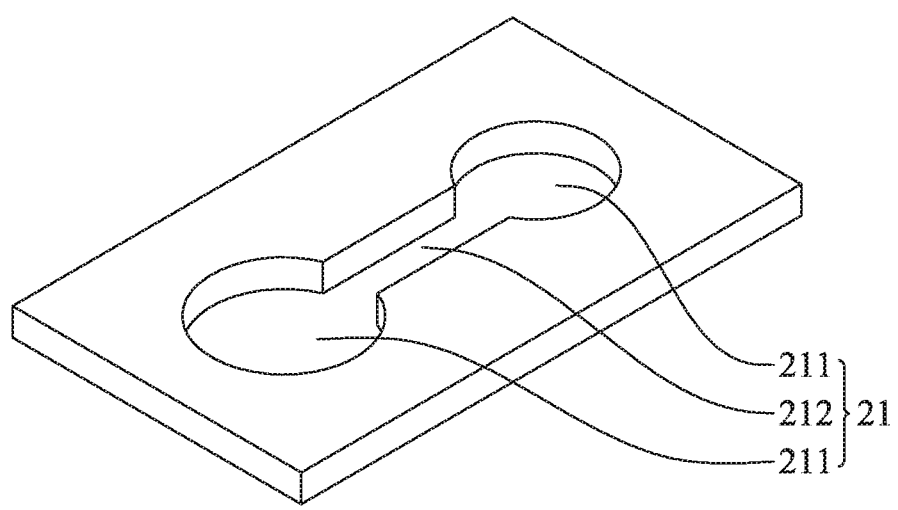
FIG. 33 is a perspective view showing another embodiment of the slideway hole of the second object.
Figure 34:
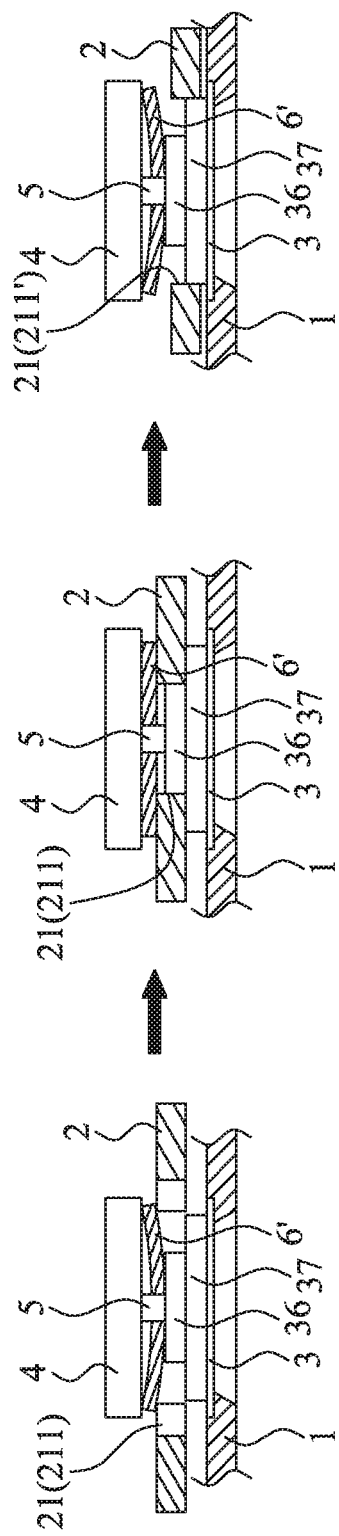
FIG. 34 shows the body portion includes a first stop portion and a second stop portion, and the two stop portions are slid to engage with the slideway hole of the second object.

In a still further variation of the eighth preferred embodiment, as shown in FIG. 32, the neck portion 5 can be provided at the end closer to the fastening head portion 4 with a diametrically expanded first stop portion 54 and a diametrically expanded second stop portion 55, such that the neck portion 5, the first stop portion 54 and the second stop portion 55 together define a stepped post-like body. In this case, the elastic element 6' has an end being stopped by or pressed against the first stop portion 54. In this variation, as shown in FIG. 33, the slideway hole 21 of the second object 2 can include two hole portions 211, 211' and one sliding slot 212 located between and communicable with the two hole portions 211, 211'. The sliding slot 212 has a width matching the first stop portion 54, the hole portion 211 has a diameter larger than the fastening head portion 4, and the hole portion 211' has a diameter matching the second stop portion 55. When sliding the neck portion 5 from the hole portion 211 of the second object 2 to the hole portion 211', the first stop portion 54 can pass through the sliding slot 212 into the hole portion 211'. At this point, the elastic element 6' will press against the second object 2, bringing the second stop portion 55 to engage with the hole portion 211'. In a still further variation of the eighth preferred embodiment, as shown in FIG. 34, the body portion 3 can include a first stop portion 36 and a second stop portion 37, and the elastic element 6' has an end stopped by or pressed against the first stop portion 36. With these arrangements, the variation shown in FIG. 34 can provide the same function and effect as the variation shown in FIG. 32.

Figure 12:
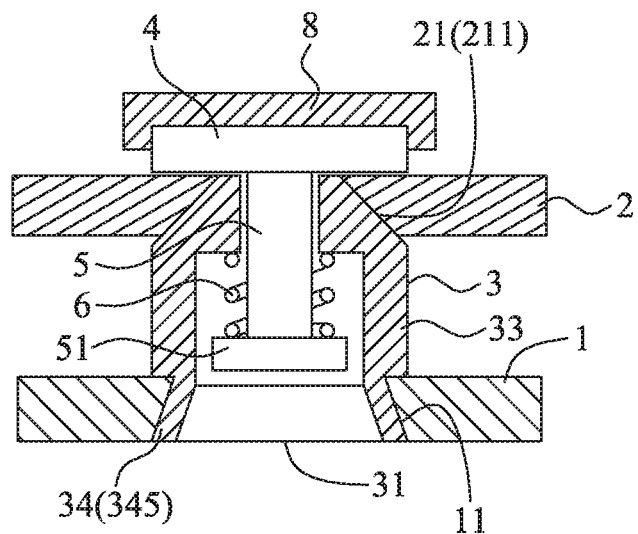
FIG. 12 is a sectional view of a vibration-proof fastener post structure according to an operable embodiment of the present invention, which includes a colored cover.
Figure 35:
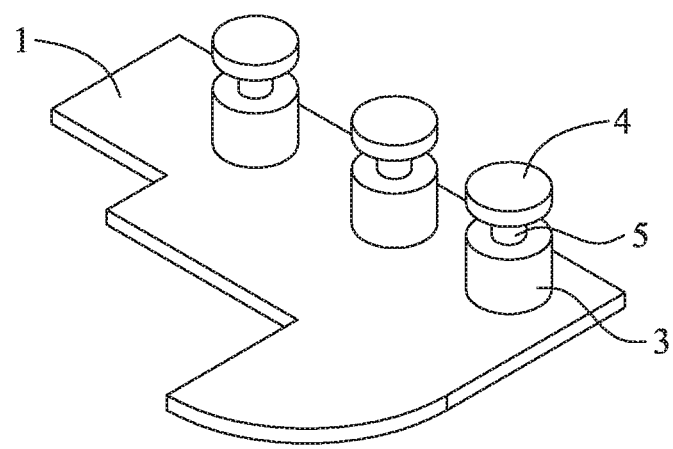
FIG. 35 is a perspective view showing a plurality of the fastener post structures of the present invention are connected to the first object to form a modularized structure.
Figure 36:
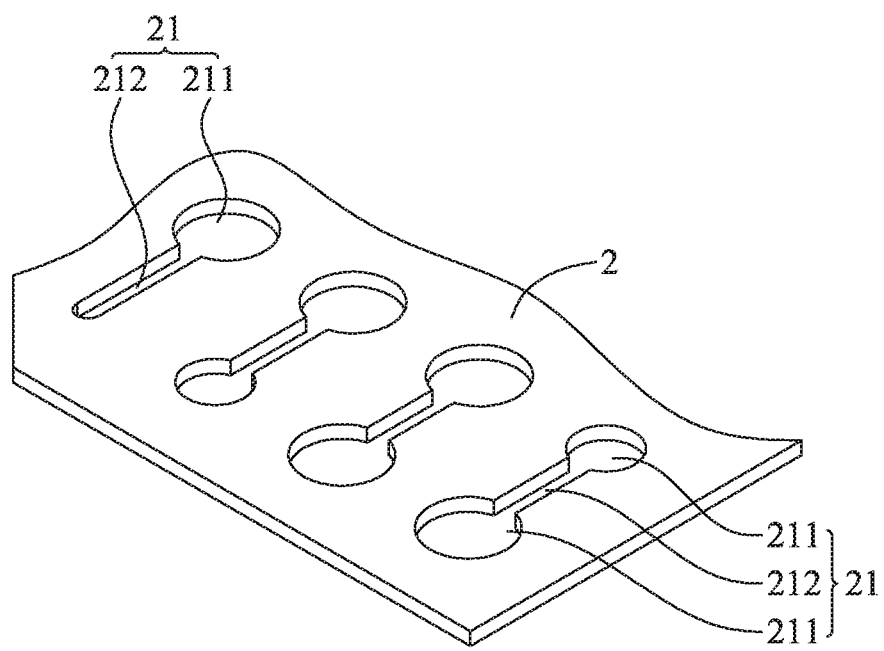
FIG. 36 is a perspective view showing some different embodiments of the slideway hole on the second object.
Figure 37A:
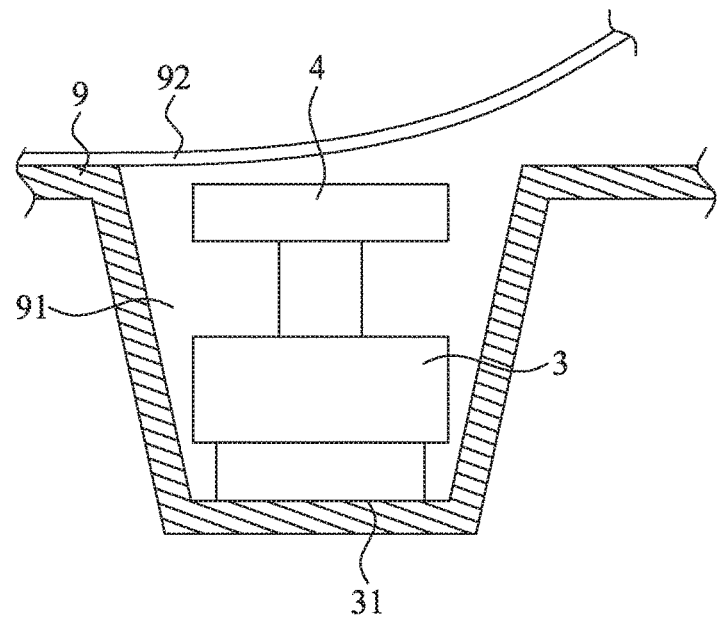
FIG. 37A is a sectional view showing an embodiment of the present invention, in which the fastener post structure can be individually disposed on a carrier.
Figure 37B:
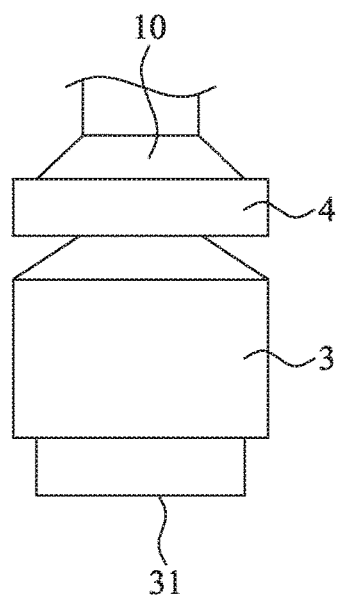
FIG. 37B shows the fastener post structure can be removed from the carrier using a tool.
Figure 37C:
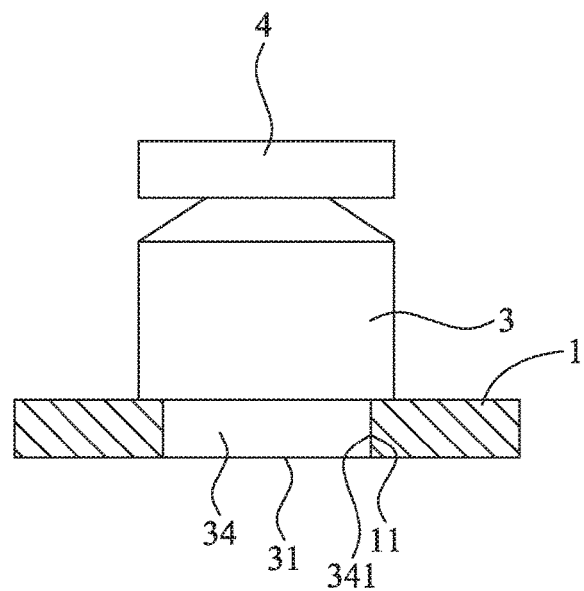
FIG. 37C shows the fastener post structure is moved by the tool to the first object for assembling.

According to an operable embodiment of the present invention, the body portion 3 can be integrally formed with or assembled to the first object 1, as shown in FIG. 35, so as to form a standardized module. The first portion 1 can be a board, a plate, a block, a strip or a polygonal body, and can be connected to a second object 2 (see FIG. 36) via any of the above-described embodiments of the vibration-proof fastener post structure according to the present invention. As shown in FIG. 12, the fastening head portion 4 can include a colored cover 8 disposed on a top thereof. The colored cover 8 can be formed on the fastening head portion 4 by way of paint spraying, plastic injection molding, glue bonding, dyeing, coating or electrical plating. Also, as shown in FIGS. 37A, 37B and 37C, the present invention can include a carrier 9, which can be formed using a mould. The carrier 9 is formed with a plurality of recessed receiving compartments 91 and a removable cover 92 for closing the receiving compartments 91 and accordingly, sealing one vibration-proof fastener post structure of the present invention in each of the receiving compartments 91. In this manner, the present invention can be applied to the surface mount technology (SMT) process, and the individual vibration-proof fastener post structures can be removed from the receiving compartments 91 with a tool 10 for connecting to the fixing holes 11 on the first object 1 by way of welding, snap-on fastening, riveting, screw-fastening, expanded connection, glue bonding or magnetic fastening.

Figure 38:
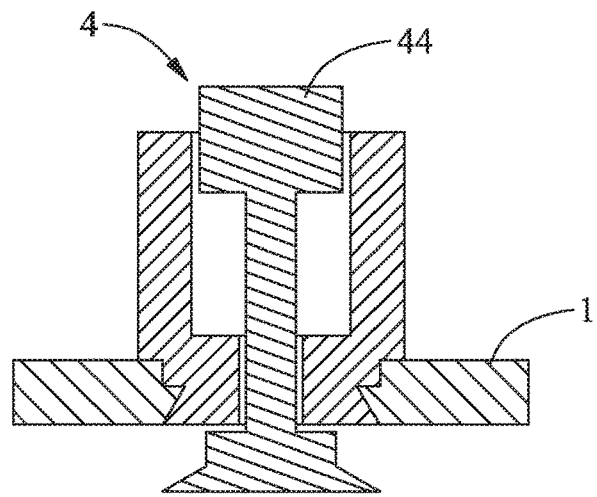
FIG. 38 is a sectional view of the vibration-proof fastener post structure according to a ninth preferred embodiment of the present invention.

FIG. 38 is a sectional view of a ninth preferred embodiment of the present invention. In the ninth preferred embodiment, the head fastening portion 4 includes a pressing section 44. A user can handle the fastening head portion 4 by applying a force to the pressing section 44.

Figure 39:
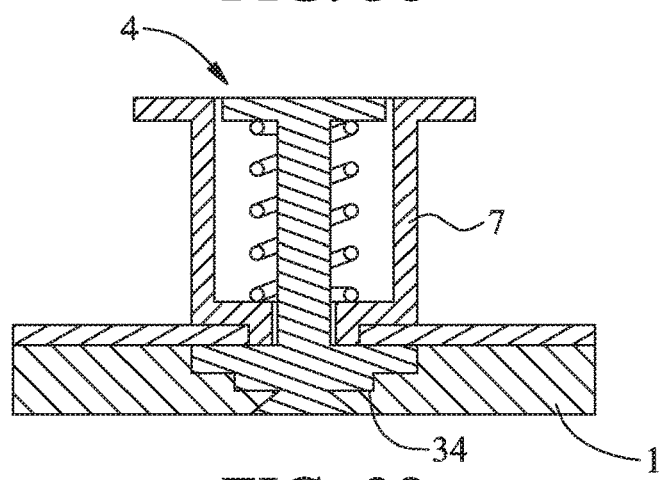
FIG. 39 is a sectional view of the vibration-proof fastener post structure according to a tenth preferred embodiment of the present invention.
Figure 40:
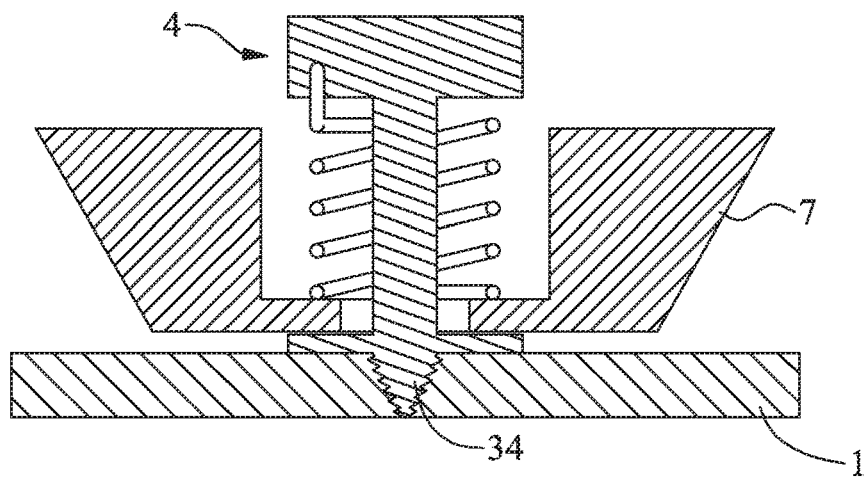
FIG. 40 is a sectional view of the vibration-proof fastener post structure according to an eleventh preferred embodiment of the present invention.

FIGS. 39 and 40 are sectional views of a tenth and an eleventh preferred embodiment of the present invention, respectively. In these two embodiments, the connecting section 34 of the body portion 3 can be a stepped section, a threaded section, a recessed section, a raised section, a cambered surface, a flat surface, a curved surface or a beveled surface, and can be connected to the first object 1 by riveting, screw-fastening, expanded connection, welding, glue bonding, SMT soldering or snap-on fastening. FIG. 39 shows the connecting section 34 is connected to the first object 1 by riveting and the fastening head portion 4 is located inside the pushing member 7. On the other hand, FIG. 40 shows the connecting section 34 is connected to the first object 1 by screw-fastening and the fastening head portion 4 is located outside the pushing member 7.

The present invention has been described with some preferred embodiments thereof and it is understood that the preferred embodiments are only illustrative and not intended to limit the present invention in any way and many changes and modifications in the described embodiments can be carried out without departing from the scope and the spirit of the invention that is intended to be limited only by the appended claims.

What is claimed is:

1. A vibration-proof fastener post structure having an end for fixedly connecting to a first object and another end for slidably connecting to a second object and engaging with a slideway hole on the second object, comprising:
    a body portion having a first end, which can be integrally formed with or assembled to the first object;
    a fastening head portion being movably mounted to a second end of the body portion and having a neck portion, which is movably disposed in the body portion for moving in the slideway hole of the second object, the neck portion includes a shoulder portion for abutting on the second end of the body portion to keep the fastening head portion away from an outer surface of the body portion by a distance; and
    an elastic element being movably fitted around the neck portion to push against an inner surface of the body portion; and
    wherein the fastening head portion and the body portion are configured for engaging with and fastening to the slideway hole of the second object.

2. The vibration-proof fastener post structure as claimed in claim 1, wherein the body portion has a first beveled guide surface facing toward the second object for engaging with and fastening to the slideway hole.

3. The vibration-proof fastener post structure as claimed in claim 1, wherein the fastening head portion has a second beveled guide surface facing toward the second object for engaging with and fastening to the slideway hole.

4. The vibration-proof fastener post structure as claimed in claim 1, wherein the fastening head portion includes a handling portion, a protruded stop portion located at one side of the handling portion facing toward the second object, and a second beveled guide surface formed on around the protruded stop portion; and the protruded stop portion and the second beveled guide surface being configured for engaging with and fastening to the slideway hole.

5. The vibration-proof fastener post structure as claimed in claim 1, wherein the neck portion includes a stopper formed at an end of the neck portion; the stopper being integrally formed with or assembled to the neck portion; and the elastic element having an end pushing against the stopper.

6. The vibration-proof fastener post structure as claimed in claim 1, wherein the fastening head portion includes a colored cover disposed on a top thereof; and the colored cover being formed on the fastening head portion by a way selected from the group consisting of paint spraying, plastic injection molding, glue bonding, dyeing, coating and electrical plating.

7. The vibration-proof fastener post structure as claimed in claim 1, further comprising a carrier and a removable cover; the carrier including a plurality of receiving compartments, each of which having one piece of the vibration-proof fastener post structure received therein; and the removable cover closing the receiving compartments.

8. The vibration-proof fastener post structure as claimed in claim 1, wherein the fastening head portion includes a pressing section.

* * * * *